United States Patent
Robinson et al.

[11] Patent Number: 5,851,038
[45] Date of Patent: Dec. 22, 1998

[54] SEALING RING

[75] Inventors: Darrell Robinson, Highland Township; Allen V. Pruehs, Howell, both of Mich.

[73] Assignee: Ekstrom Industries, Inc., Farmington Hills, Mich.

[21] Appl. No.: 770,661

[22] Filed: Dec. 20, 1996

Related U.S. Application Data

[60] Provisional application No. 60/018,997 Jun. 3, 1996.

[51] Int. Cl.[6] .......................... B65D 45/30; B65D 45/32; A44B 1/04
[52] U.S. Cl. ...................... 292/256.67; 292/320; 24/279; 411/410
[58] Field of Search ......................... 292/256.67, 256.65, 292/256.69, 104, 205, 320; 24/274 R, 279; 411/403, 404, 410

[56] References Cited

U.S. PATENT DOCUMENTS

| | | |
|---|---|---|
| 2,643,150 | 6/1953 | Giles . |
| 2,651,094 | 9/1953 | Dodge ........................................ 24/279 |
| 2,787,039 | 4/1957 | Krasberg ................................... 24/279 |
| 2,943,876 | 7/1960 | Morris . |
| 2,968,508 | 1/1961 | Campbell et al. . |
| 3,154,829 | 11/1964 | Pahel et al. ............................... 24/279 |
| 3,172,282 | 3/1965 | Heckrotte . |
| 3,259,414 | 7/1966 | Rothert . |
| 3,265,426 | 8/1966 | Brooks et al. . |
| 3,396,439 | 8/1968 | Schaub . |
| 3,737,959 | 6/1973 | Smith ....................................... 24/279 |
| 4,134,609 | 1/1979 | Santoni . |
| 4,225,165 | 9/1980 | Kesselman . |
| 4,310,956 | 1/1982 | Meckstroth et al. ...................... 24/279 |
| 4,329,860 | 5/1982 | Moberg . |
| 4,422,679 | 12/1983 | Ruscitto . |
| 4,531,770 | 7/1985 | Mattress, Jr. . |
| 4,934,747 | 6/1990 | Langdon et al. . |

FOREIGN PATENT DOCUMENTS 750894  6/1956  United Kingdom .................. 411/410

*Primary Examiner*—Neill Wilson
*Attorney, Agent, or Firm*—Young & Basile, PC

[57] ABSTRACT

A sealing ring for an electric watthour meter apparatus has first and second housings mounted on opposed ends of an annular band. A fastener extends through a threaded aperture in an end wall of one housing into threaded engagement with an aperture in an end wall of the opposed housing to fixedly engage the ends of the sealing ring. A plurality of radially intersecting slots in one end of the fastener are alignable with apertures in one of a plurality of side walls of one of the housings for receiving a security device. Screwdriver receiving slots are formed in each of the first and second ends of the fasteners. An axial slot is formed in the second end of the fastener and alignable with apertures in the side walls of the other housing for receiving a security device. An enlarged head end on the fastener enables finger rotation of the fastener. The end walls have an elongated upper end forming a finger grip surface to facilitate movement of the first and second housings toward each other. Bendable mounting tabs extend from the first and second housings into slots in the annular band to fixedly mount the housings to the annular band. Alternately, a notched projection formed on a bottom wall of a cast housing engages an edge of a slot in the annular band and cooperates with a fastener extending through the bottom wall of the housing and the annular band to securely fix the housing to the annular band.

73 Claims, 15 Drawing Sheets

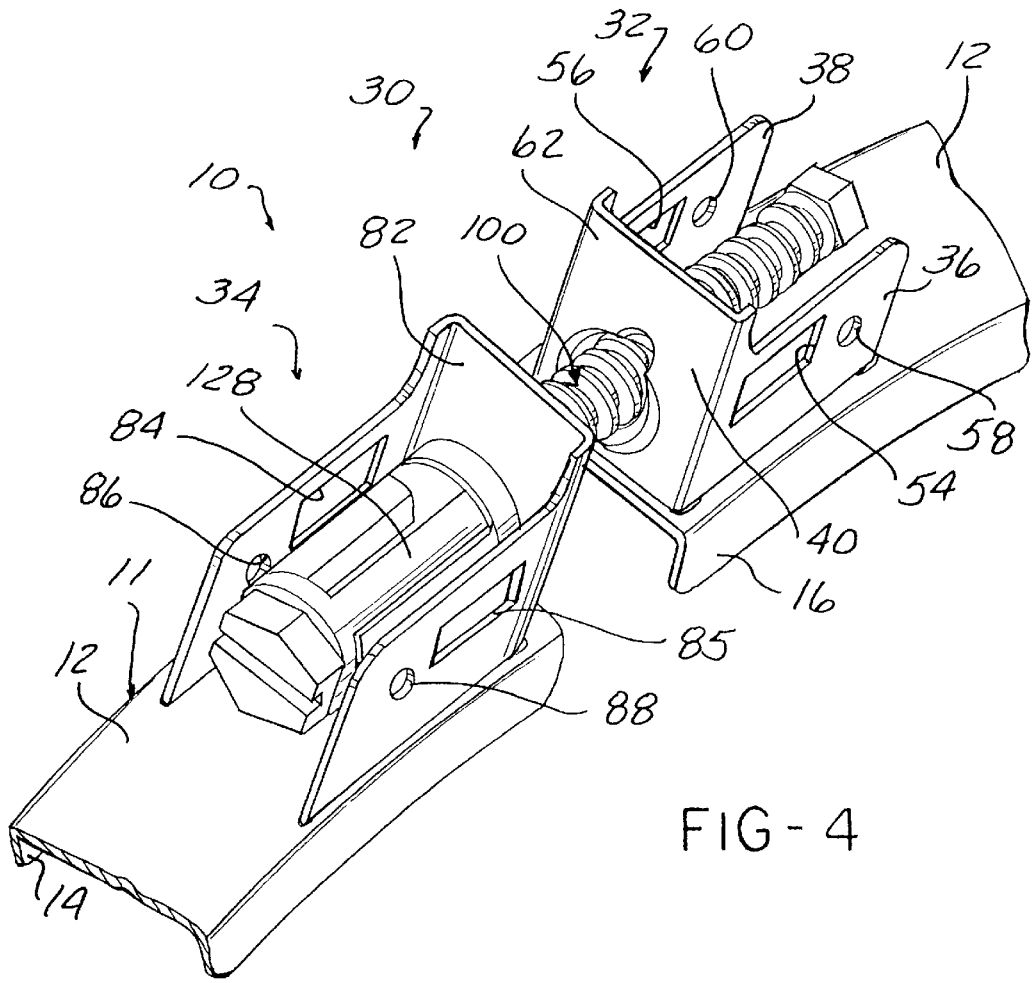

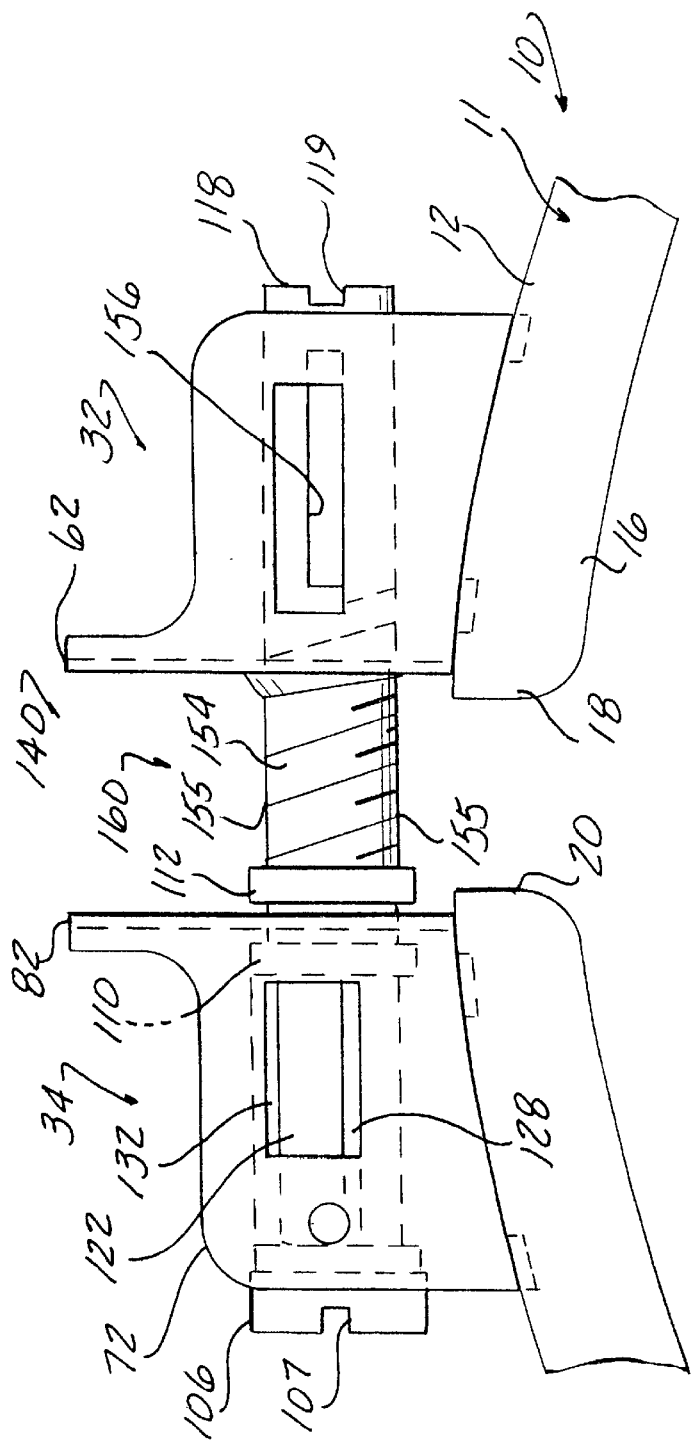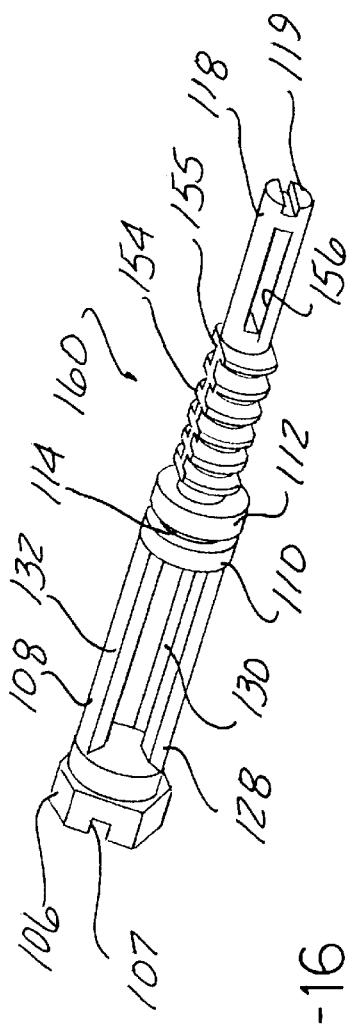

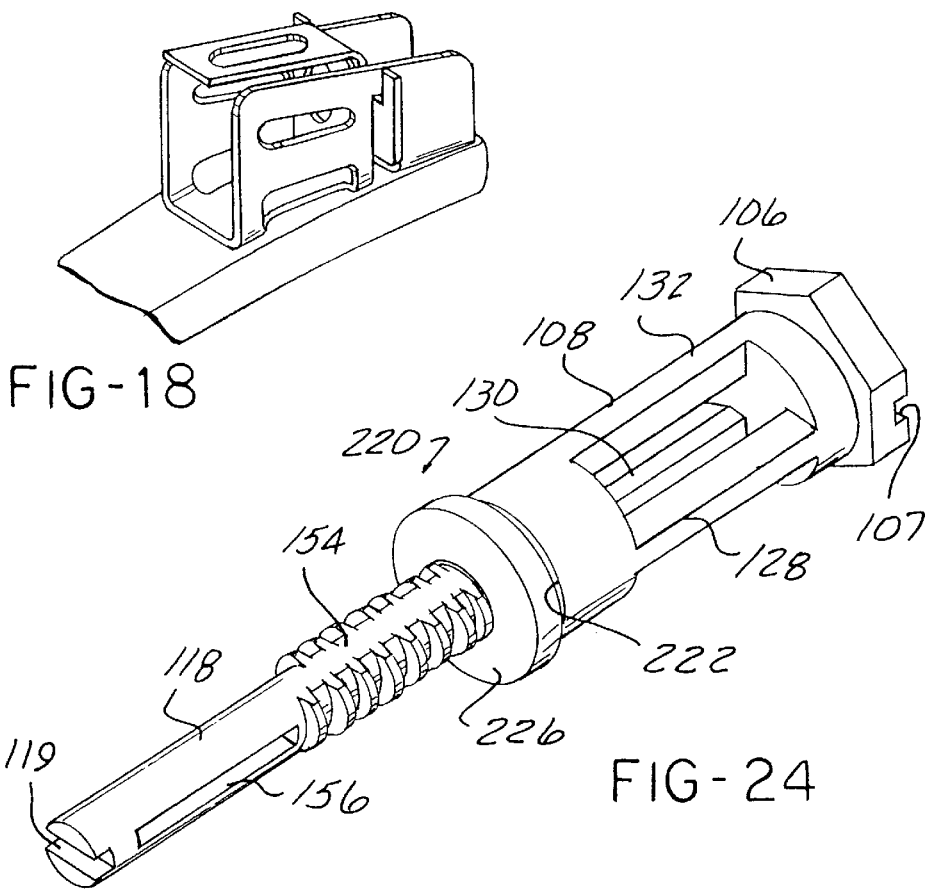
FIG-18
FIG-24
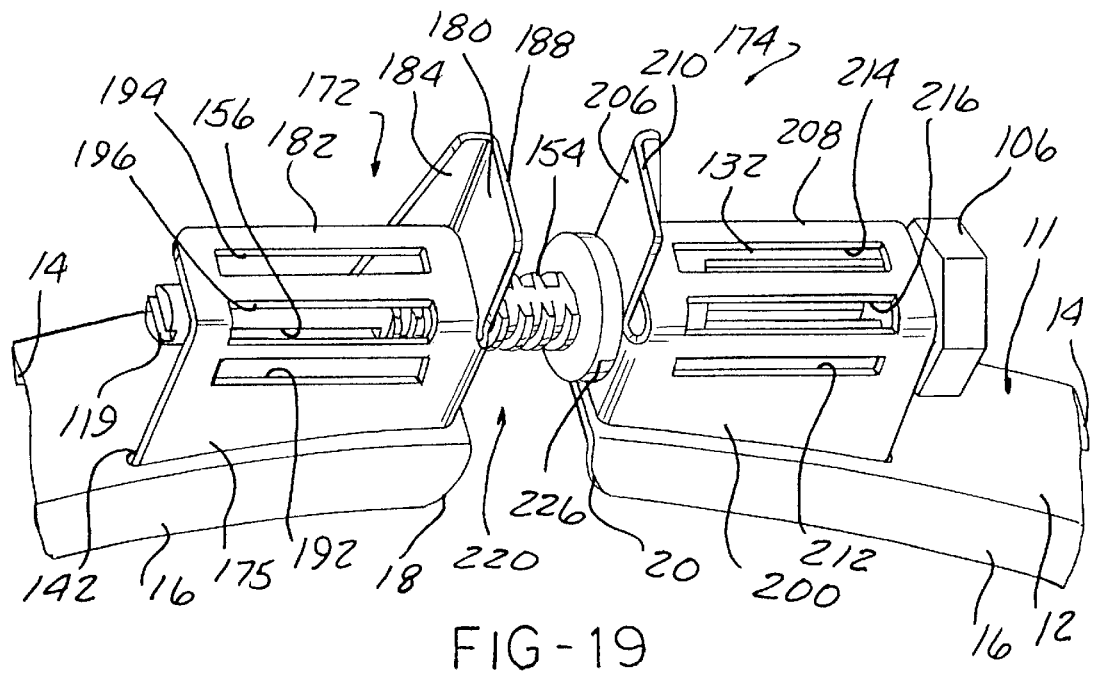
FIG-19

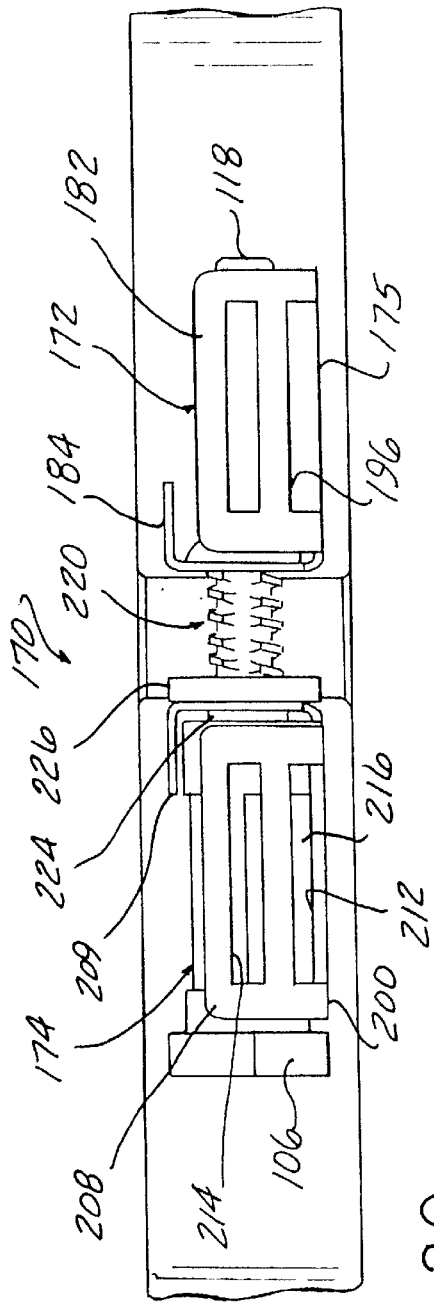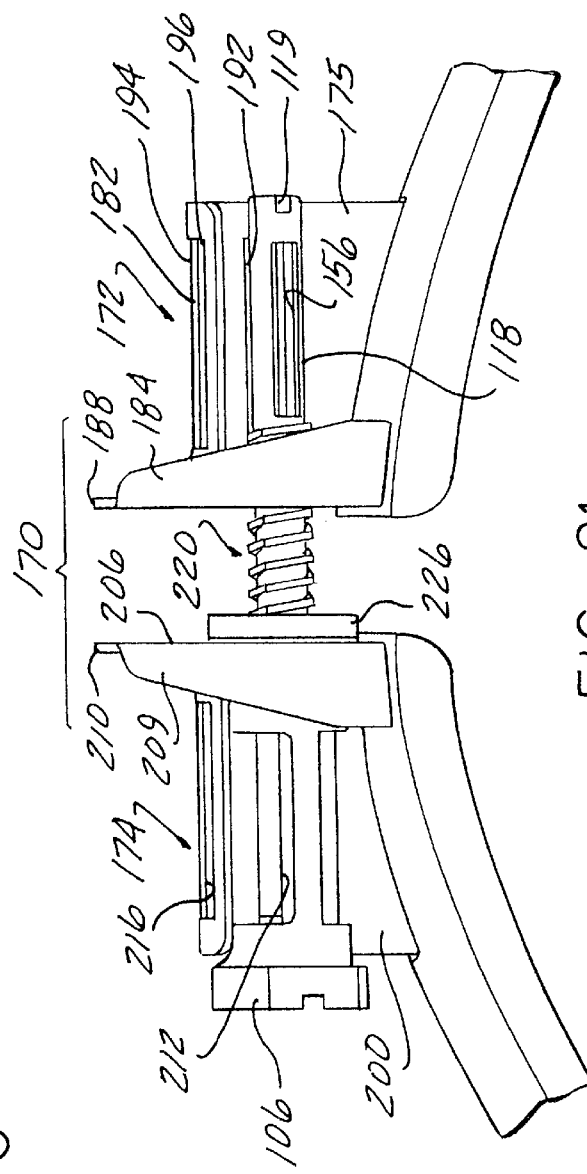

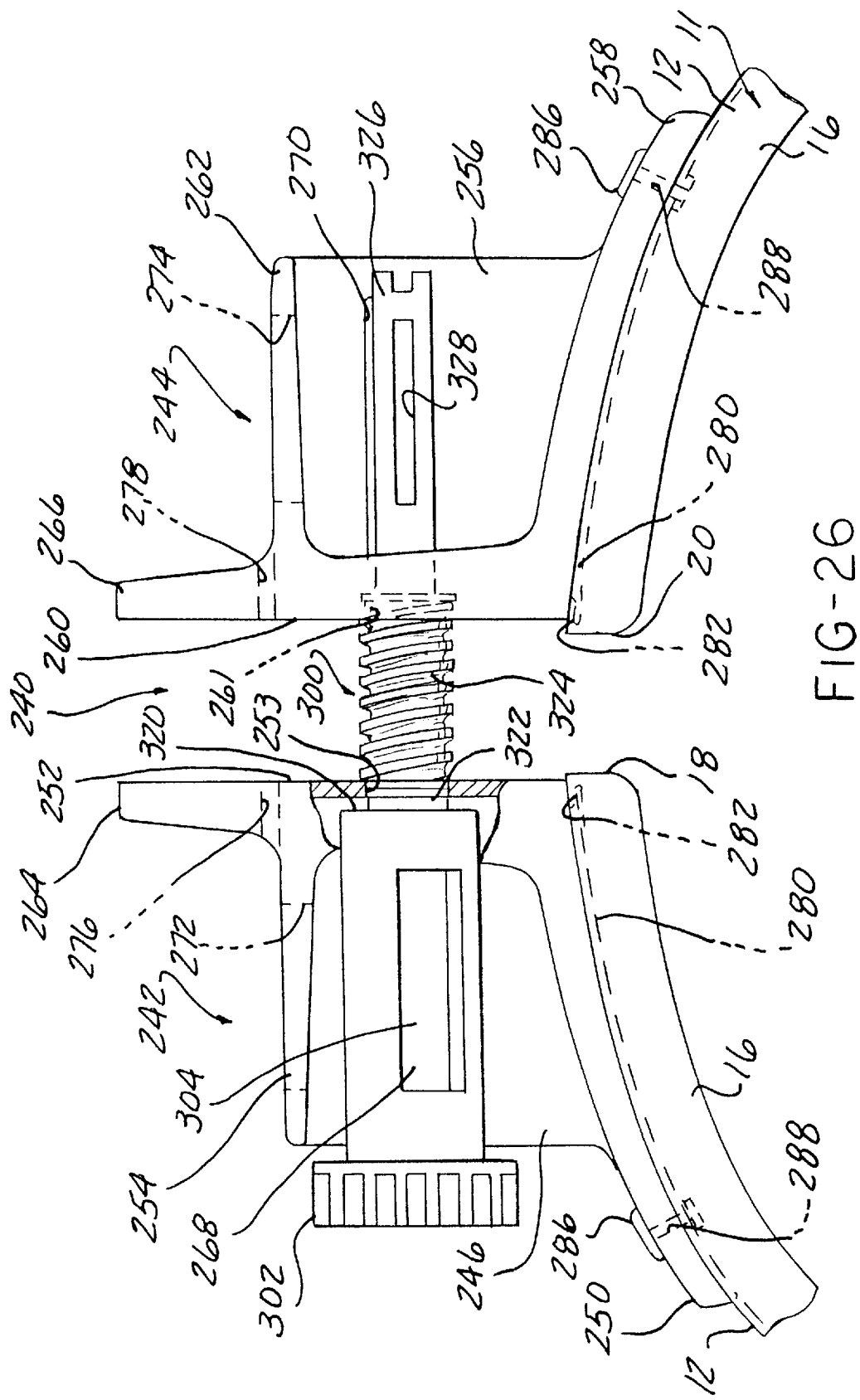

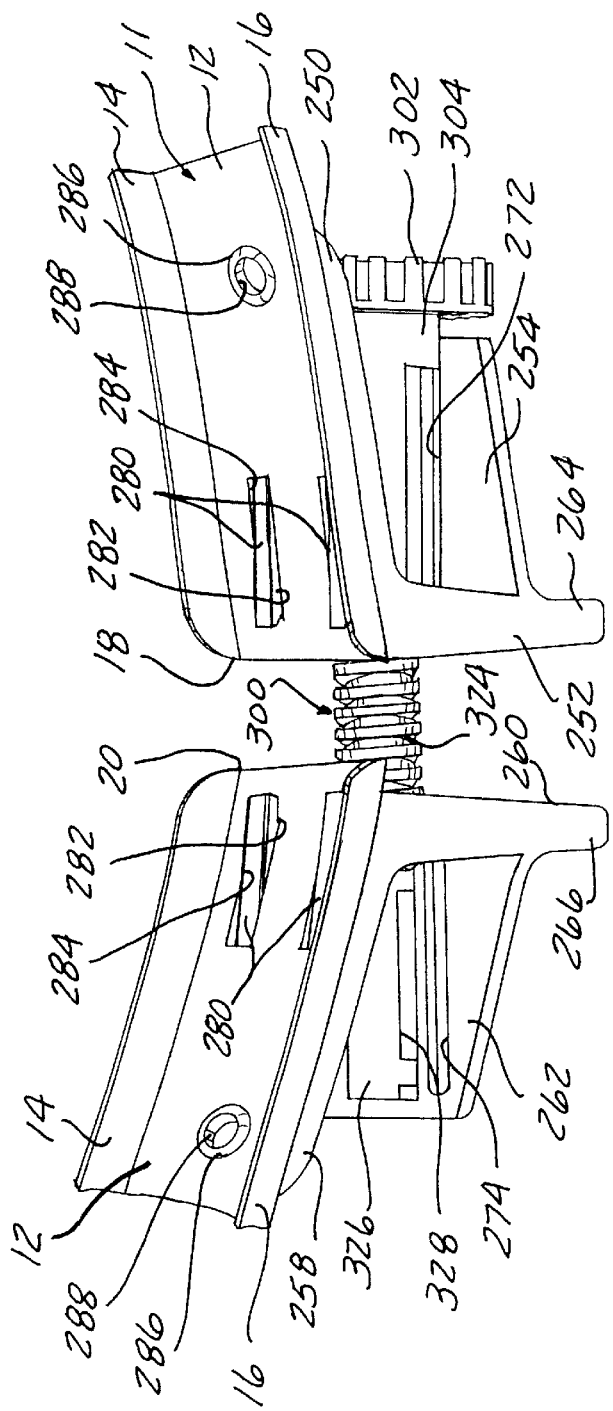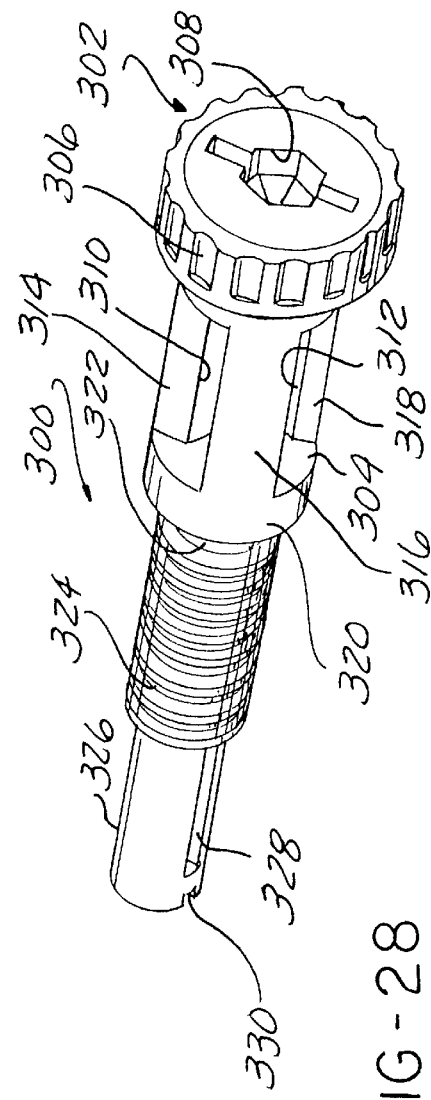

SEALING RING

CROSS-REFERENCE TO RELATED APPLICATION

This application claims the benefit of U.S. Provisional application Ser. No. 60/018,997, filed Jun. 3, 1996.

BACKGROUND OF THE INVENTION

1. Field of the Invention

The present invention relates, in general, to watthour meters and meter sockets, and more specifically, to sealing rings for electric watthour meter and meter sockets.

2. Description of the Art

In the electric utility industry, plug-in, socket-type watthour meters are commonly employed to measure electric power consumption at a residential or commercial building establishment. A socket is mounted on a wall of the residence or building and contains terminals which are connected to electric line and electric load conductors. The terminals are also connected to internal conductors within the socket which extend to jaw contacts positioned to receive the blade terminals of a plug-on watthour meter to complete an electric circuit through the watthour meter between the line and load terminals and the conductors.

One type of meter socket has a ring-type cover which includes an outwardly projecting, annular mounting flange surrounding an opening in the cover through which the blade terminals of a watthour meter extend. The mounting flange is sized to mate with a complementary formed mounting flange on the bottom of the watthour meter.

The two mating mounting flanges are held together by a sealing ring. A common type of meter socket sealing ring includes a slip lock in which an outwardly extending tab on one end of the ring slips within in a slot formed on the other end of the ring. Another common type of sealing or clamping ring has a bolt passing through downturned tabs formed on the ends of the ring.

Yet another type of sealing ring is disclosed in U.S. Pat. No. 4,934,747, assigned to the assignee of the present invention. In this sealing ring, a tongue is formed on a first end of an annular band and includes a plurality of linearly spaced apertures. A housing is securely mounted on the other or second end of the band and includes a passage through which the tongue retractably extends. A threaded fastener or screw is pivotally mounted in the housing to threadingly engage the spaced apertures in the tongue to advance or retract the first end of the band toward or away from the second end of the band. Two spaced tabs are spaced from the second end of the band and fit within the apertures in the tongue of the band. A seal means, such as a wire seal or plastic padlock is insertable through apertures in each tab to indicate a sealed mounting of the sealing ring on the mounting flanges of the watthour meter and the watthour meter socket.

Another type of sealing ring made by several different manufacturers is shown in FIG. 1. In this sealing ring, two substantially identical U-shaped housings are riveted on opposite ends of an annular band. Aligned apertures or slots are formed in the side walls of each housing. An additional slot in each housing receives an insert having a threaded aperture formed centrally therein. A threaded screw with a screw head is captively mounted in one insert in one housing. The opposite threaded end of the fastener is threadingly engagable with the threaded aperture in the insert in the other housing. The end of the fastener opposite the screw head has an elongated slot which is rotatably alignable with the apertures in the side walls of one housing to receive a wire seal or plastic padlock after the sealing ring has been mounted about the mating mounting flanges of a watthour meter and meter socket cover.

ANSI industrial standards for watthour meters and watthour meter sockets establish maximum and minimum circumferential dimensions for a watthour meter which differ by approximately 0.267 inches. A sealing ring must accommodate this potential diameter range.

A problem with the previously described prior art sealing rings is the limited number of positions in which the sealing ring is tightly disposed about the mating mounting flanges and the apertures in the band or screw fasteners are alignable with corresponding apertures for receiving a seal.

In the prior art sealing ring shown in FIG. 1, only five separate positions over the maximum variation of a watthour meter diameter exist where the screw slot is aligned with the apertures in the side walls of the sealing ring housing to receive a seal therethrough. In U.S. Pat. No. 4,937,747, the size and spacing of the slots in the ends of the band which fit over the tabs provide only two possible diameter positions over the entire diameter range of a watthour meter.

FIG. 18 depicts a portion of another prior art sealing ring which is similar to the sealing ring shown in FIG. 1 and described above. This sealing ring includes an additional member having a leg extending over the top edge of the two side walls of one housing, an intermediate leg or wall extending in front of the fastener receiving insert and a lower leg extending along the lower wall of the housing and riveted to the housing and one end of the sealing ring. An elongated slot is formed in the first leg of the additional member to enable a security device to be passed through the first leg, the aperture in the end of the fastener, and one of the apertures in one of the side walls of the housing.

The use of the additional member provides two additional rotated positions of the fastener for receiving a security device. However, the member adds additional components including the rivets to the sealing ring, as well as requiring additional labor due to its being riveted to the housing and the sealing ring.

Due to these mounting positional limitations, it is possible that the sealing ring would have to be loosened from a full tight fit about the mating mounting flanges of a watthour meter and meter socket cover to align the slot in the fastener with the adjacent slots in the housing of the sealing ring to easily receive a seal therethrough. Even a small degree of looseness in the sealing ring can possibly enable the sealing ring to be unscrewed over the mating mounting flanges thereby enabling removal of the watthour meter and an attempt made to unauthorizedly receive unmetered electric power from the meter socket.

In certain applications, a watthour meter socket adapter or socket extender engages the jaw contacts in a watthour meter socket and receives the blade terminals of a watthour meter. The watthour meter socket adapter has a base mounting flange which mates with the mounting flange or rim on a watthour meter ring-style socket cover. A second mounting flange or rim is formed on the opposite end of the watthour meter socket adapter for mating with the mounting flange on a watthour meter. Sealing rings are employed at both flange ends of the meter socket adapter.

It would be desirable to provide a sealing ring for watthour meter and meter socket which has a greater number of sealing alignment positions to ensure a tight mounting fit of the sealing ring about the mounting flanges of a watthour meter, watthour meter socket adapter or watthour meter socket over the full range of possible watthour meter diameters. It would also be desirable to provide a sealing ring which is simple to manufacture for a reduced manufacturing cost. It would also be desirable to provide a sealing ring which is formed of a minimal number of components for a reduced manufacturing cost. It would also be desirable to provide a sealing ring in which an external seal can be inserted on either end of the sealing ring lock means. It would also be desirable to provide a sealing ring with a lock means which has a tool receiving means at two opposite ends to enable threading of the sealing ring lock from either end. It would also be desirable to provide a sealing ring having a threaded screw fastener with an enlarged head end for finger start and rotation of the screw fastener. Finally, it would be desirable to provide a sealing ring in which the lock means has enlarged grip tabs which enable one hand closing of the two ends of the sealing ring together about the mounting flanges of a watthour meter, watthour meter socket adapter or watthour meter socket.

SUMMARY OF THE INVENTION

The present invention is a sealing ring which simplifies the installation of a security device or seal thereto when the sealing ring is mounted about the mated mounting flanges of two joined devices.

In a preferred embodiment the sealing ring of the present invention includes an annular band having first and second spaced ends. First and second housings are mounted on the annular band adjacent the first and second ends, respectively. Each of the housings is formed with at least two side walls which extend from an end wall. Aligned apertures are formed in each of the end walls of the first and second housing. The aperture in the end wall of one of the housings threadingly receives a screw fastener rotatably mounted through the aperture in the end wall of the other housing.

The fastener has first and second ends. A plurality of intersecting, radially extending slots in the first end of the fastener and form a plurality of through passages, at least one of which is substantially alignable on rotation of the fastener with aligned apertures formed in the side walls of the housing to permit the easy passage of a security device, such as a wire seal or plastic padlock, through the slots and the aligned apertures.

The end walls of the first and second housings extend above the upper edges of the side walls of the housings to form finger tabs to enable an installer to more easily apply a closing force by one hand onto the housings to close the sealing ring about the mating mounting flanges of two devices.

In one embodiment, the housings are also provided with at least one and preferably a plurality of bendable or formable mounting tabs which are insertable through slots in the first and second ends of the annular band and then bent or crimped to securely attach the housings to the annular band. This eliminates the need for rivets as employed in previously devised sealing rings. In another embodiment, the housings are cast or molded with a notched projection formed in a bottom wall of each housing which engages one edge of a slot formed in the annular band. A mechanical fastener, such a rivet, extends through the bottom wall at a position spaced from the notched projection and through the annular band to secure the each housing to one end of the annular band.

The threaded aperture formed in the end wall of each of the housings is an integral part of each housing. This eliminates the need for a separate insert having a threaded aperture as in certain previously devised sealing rings. In addition, the threaded aperture in one of the housings which receives the threaded end of the fastener is formed during the stamping or molding of the housing to eliminate the need for a separate tapping operation to form the threaded aperture.

In one embodiment, the two side walls extend in parallel from opposite side edges of the end wall. In another embodiment, the two side walls are integrally formed as a one-piece wall, with one side wall bent at an angle to the other side wall to overlay two adjacent sides of one end of the fastener. In the latter embodiment, a short third side wall or leg extends from one side edge of the end wall and has a mounting tab formed thereon to for use in mounting the housing to the sealing ring. The one mounting tab on the short third leg may be enlarged to provide additional strength in securing the housing to the sealing ring.

The fastener also has an enlarged head end which can be easily grasped by the fingers of a user and/or engaged by a tool to insert the opposite end of the screw fastener into the aperture in the end wall of the opposed housing as well as to at least initially thread the screw fastener into the opposite housing. The fastener and the housing having a dimensional relationship so that the enlarged head end extends outward from the end of the housing for each finger grasping.

Further, the fastener is formed with a pair of spaced collars which are mountable on opposite sides of the end wall of the housing. This axially fixes the fastener from substantial axial movement relative to the housing; while still being rotatable. This has the further advantage of positioning the enlarged head end of the fastener outside of the end of the housing for easy access and, also, maintains the radial slots in the fastener axially disposed between the apertures in the housing for easy insertion of a security device therethrough.

The screw fastener, in addition to the plurality of radially extending slots in one end, also has an elongated slot in the opposite end. This enables a security device or seal to be inserted through one or both ends of the screw fastener and either or both housings on the ends of the annular band of the sealing ring for additional security or to simplify installation of the security device.

In an alternate embodiment, apertures may be formed in the end wall of each housing so as to enable a security device, such as a wire seal or padlock, to be passed through the apertures in the end walls to secure or seal the two housings together.

The enlarged head of the screw fastener has a tool receiving means or recess formed therein, such as a screwdriver receiving slot. Preferably, the opposite end of the screw fastener also has a tool receiving means formed therein to enable the screw fastener to be threaded or unthreaded relative to the two housings from either end. This simplifies use of the sealing ring in conditions where access to one end of the screw fastener may be blocked.

The sealing ring of the present invention overcomes certain deficiencies encountered with previously devised sealing rings used with electric watthour meters and meter sockets. In addition to the advantages described above, the sealing ring of the present invention is formed of a minimal number of components; i.e., four, including the annular band, the two housings, and the screw fastener. This compares extremely favorably with the nine separate components, including the four rivets used to form the sealing ring disclosed in U.S. Pat. No. 4,934,747 or the ten separate components, including rivets, used to form the prior art sealing ring shown in FIG. 1. Besides simplifying the manufacture of the sealing ring, the minimal number of components used to form the present sealing ring also contributes to a significantly reduced manufacturing cost for the sealing ring.

The features of the present sealing ring also simplify the installation and use of the sealing ring when the sealing ring is installed about the mating mounting flange of a watthour meter, watthour meter socket adapter and/or watthour meter socket and tightened or untightened. The grip tabs enable the installer to forcible urge the two ends of the sealing ring together with the fingers of one hand while being able to use another hand to start and at least initially tighten the screw fastener between the two housings. The provision of tool receiving means or screwdriver slots on both ends of the screw fastener enables the installer to tighten or untighten the screw fastener from either end thereby simplifying use of the sealing ring in mounting applications where access to the screw fastener may be hindered or impossible.

In the cast or molded housing embodiment, a larger diameter aperture may be formed in the end wall of each housing to enable a larger diameter screw fastener to be employed with the sealing ring of the present invention. The larger diameter fastener has higher strength thereby providing increased security.

Further, the provision of seal receiving apertures on both ends of the screw fastener which are rotatably alignable with apertures in both housings enables a security device or seal to be inserted through either or both ends of the sealing ring thereby providing additional security, or providing separate indications of sealing, inspection, etc., as well as simplifying the insertion of the seal where access to one end of the screw fastener and housing may be blocked or difficult to reach.

BRIEF DESCRIPTION OF THE DRAWINGS

The various features, advantages, and other uses of the present invention will become more apparent by referring to the following detailed description and drawing in which:

FIG. 4 is a partial, enlarged perspective view of the sealing ring lock mechanism shown in FIG. 3;

FIG. 5 is a plan view of the lock mechanism shown in FIG. 4;

FIG. 16 is a right-hand, perspective view of the screw fastener employed in the embodiment depicted in FIG. 12;

FIG. 17 is a side elevational view of the lock device shown in FIGS. 12–16 in an engaged position;

FIG. 18 is a partial, perspective view showing another prior art sealing ring housing;

FIG. 19 is a partial, enlarged, perspective view of yet another embodiment of a lock mechanism employed on a sealing ring of the present invention taken from a direction 180° from the orientation shown in FIG. 4;

FIG. 20 is a top, plan view of the lock mechanism shown in FIG. 19;

FIG. 21 is a side elevational view of the lock mechanism shown in FIGS. 19 and 20, but reversed 180° from FIGS. 19 and 20;

FIG. 24 is an enlarged, perspective view of the screw fastener used in the embodiment depicted in FIGS. 19–23;

FIG. 26 is a side elevational view of the lock mechanism in the sealing ring shown in FIG. 25;

FIG. 27 is an inverted, normal mounting position depiction of the sealing ring and lock mechanism shown in FIGS. 25 and 26; and FIG. 28 is an enlarged, perspective view of the fastener shown in FIGS. 25–27.

DESCRIPTION OF THE PREFERRED EMBODIMENT

Figure 1:
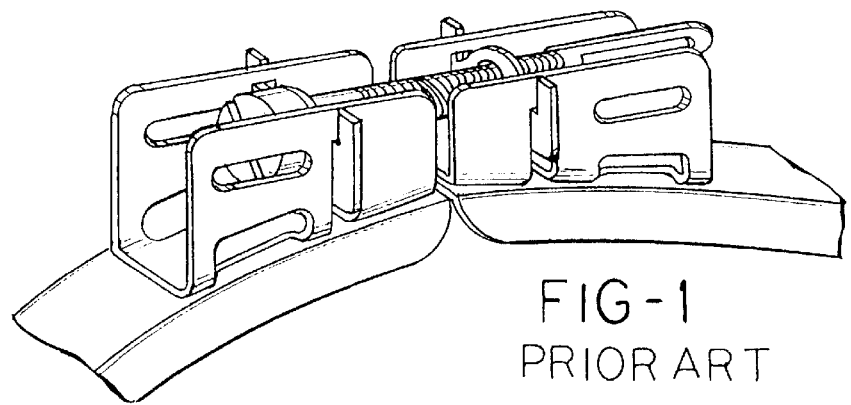
FIG. 1 is a perspective view of a prior art sealing ring.

The present invention, as shown in FIGS. 2–17 and 19–24, is a sealing ring 10 which is used to releasably mount a conventional electric watthour meter 1, blank cover, or a simulated meter on a meter socket 2 or watthour meter socket adapter 3. The sealing ring 10 may also be employed to releasably mount a watthour meter socket 3 adapter on a watthour meter socket 2.

As is conventional, an electric watthour meter 1, a watthour meter adapter 3, and a watthour meter socket 2 are provided with mating mounting flanges which abut each other to form an annular surface when, for example, a watthour meter 1 is mounted in a watthour meter socket 2. The watthour meter 1 has a base mounting flange 5 which is engagable with a mounting flange 6 on the cover of the meter socket 2 and/or with a mounting flange 7 on the meter socket adapter 3. A base mounting flange 6 on the meter socket adapter 3 is engagable with the flange 5 on the cover of the meter socket 2. The sealing ring 10 is releasably mounted about the mating flanges 4, 7 and/or 6, 5 and/or 4, 5 and locked in place to securely retain the watthour meter 1 on the watthour meter socket 2, or to retain the watthour meter socket adapter 3 on the watthour meter socket 2 or to retain the watthour meter 1 on the watthour meter socket adapter 3.

Figure 3:
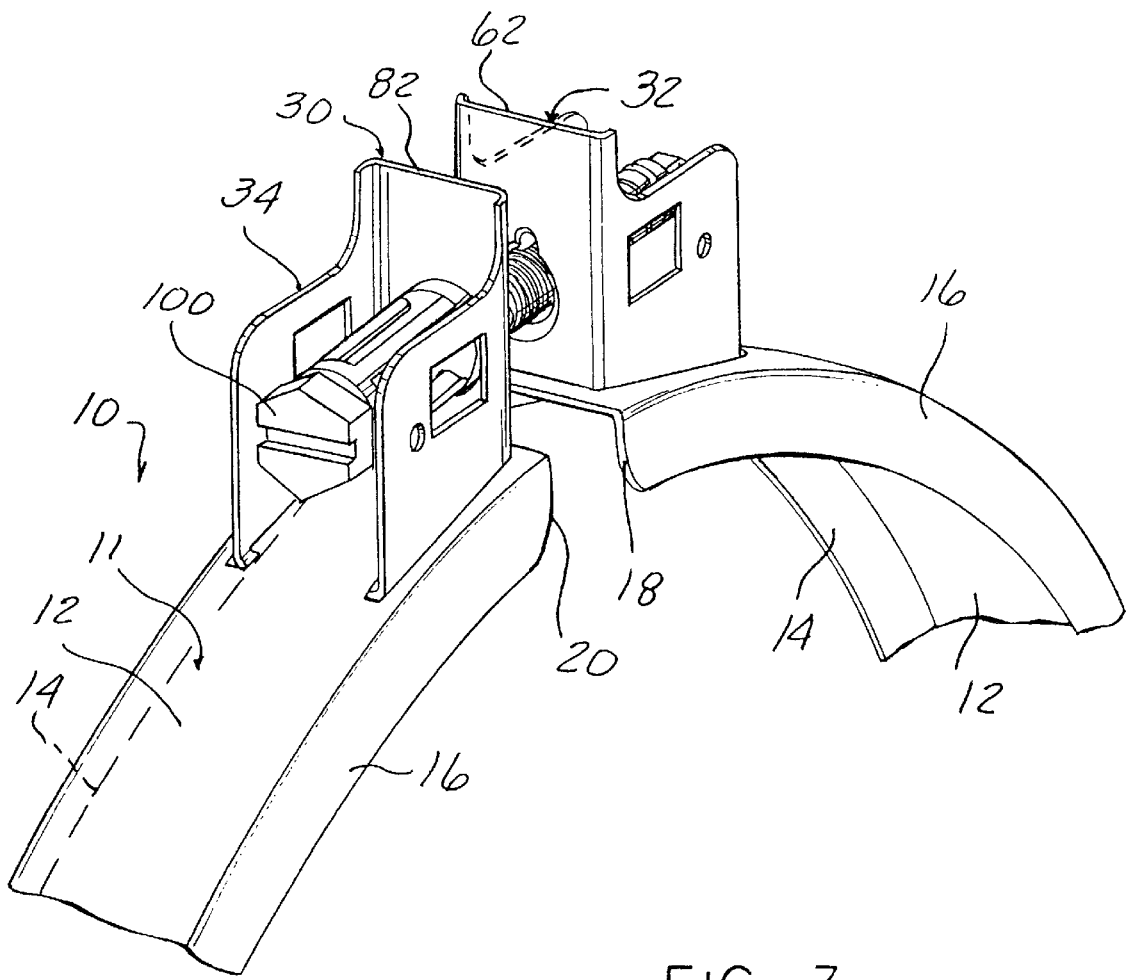
FIG. 3 is a perspective view of a sealing ring constructed in accordance with the teachings of the present invention.

The sealing ring 10, as shown in greater detail in FIG. 3, is in the form of an annular band 11 having a generally U-shaped cross section formed by a planar central portion 12 and two depending side flanges 14 and 16. The width of the central portion 12 and the length of the side flanges 14 and 16 are selected to snugly fit around the engaged mounting flanges of the watthour meter 1, the watthour meter socket adapter 3 and/or the watthour meter socket 2. The annular band 11 is formed of any suitable material, such as a metallic material, i.e., steel or aluminum. Preferably, stainless steel is employed to form the band 11.

The annular band 11 is formed with first and second spaced ends 18 and 20, respectively. The first and second ends 18 and 20 will normally be brought into close proximity when the sealing ring 10 is lockingly mounted about the mating mounting flanges of two devices. Conversely, the first and second ends 18 and 20 may be separated when the lock mechanism employed on the sealing ring 10, as described hereafter, is released enabling the diameter of the sealing ring 10 to be enlarged so as to permit the sealing ring 10 to be removed from the mounting flanges.

A releasable lock mechanism denoted generally by reference number 30 in FIGS. 3–6, 9 and 10 is carried on the sealing ring 10 for releasably locking the sealing ring 10 about the mating mounting flanges of two devices.

The lock mechanism 30 is formed of first and second substantially identical housings 32 and 34, respectively. The first and second housings 32 and 34 are mounted on the sealing ring 10 adjacent the first and second ends 18 and 20, respectively.

The first housing 32 is formed of a suitable high strength material, such as stainless steel, and, as shown in FIGS. 3–6 and 9, has a generally U-shaped cross section formed of spaced side walls 36 and 38 joined at one end by a co-extensive end wall 40. Each side wall 36 and 38 respectively has a top edge 42 and 46 and a generally arcuate shaped lower edge 44 and 48, respectively. The first housing 32 may also be formed of other materials, such as a high strength plastic, etc.

Figure 6:
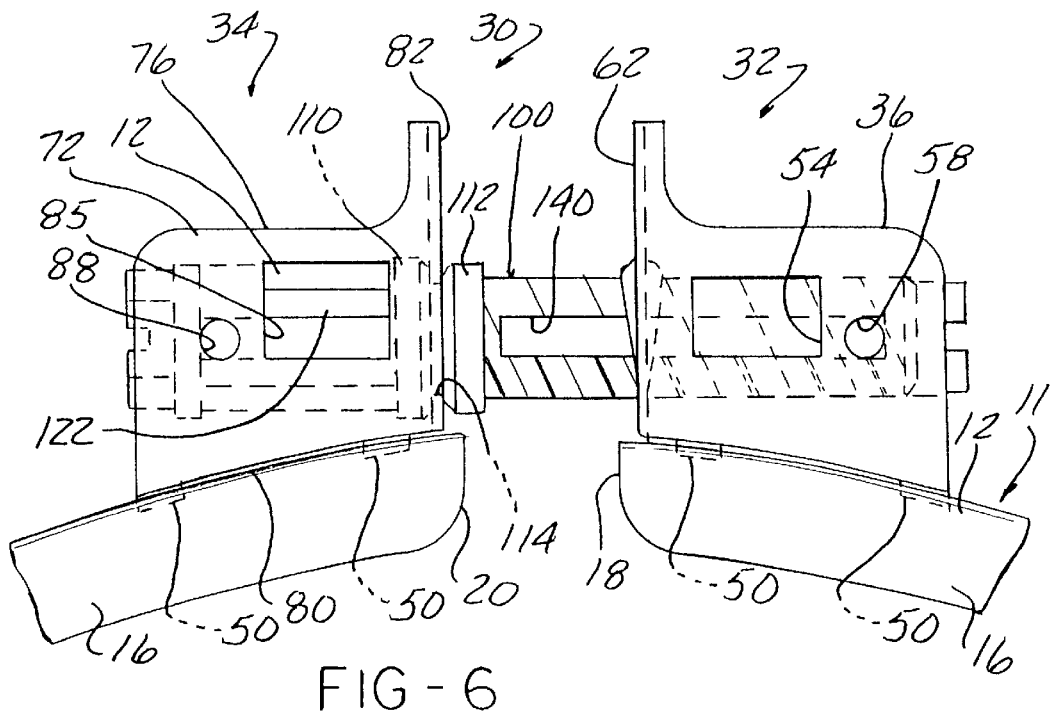
FIG. 6 is a side elevational view of the lock device shown in FIGS. 3–5.
Figure 11:
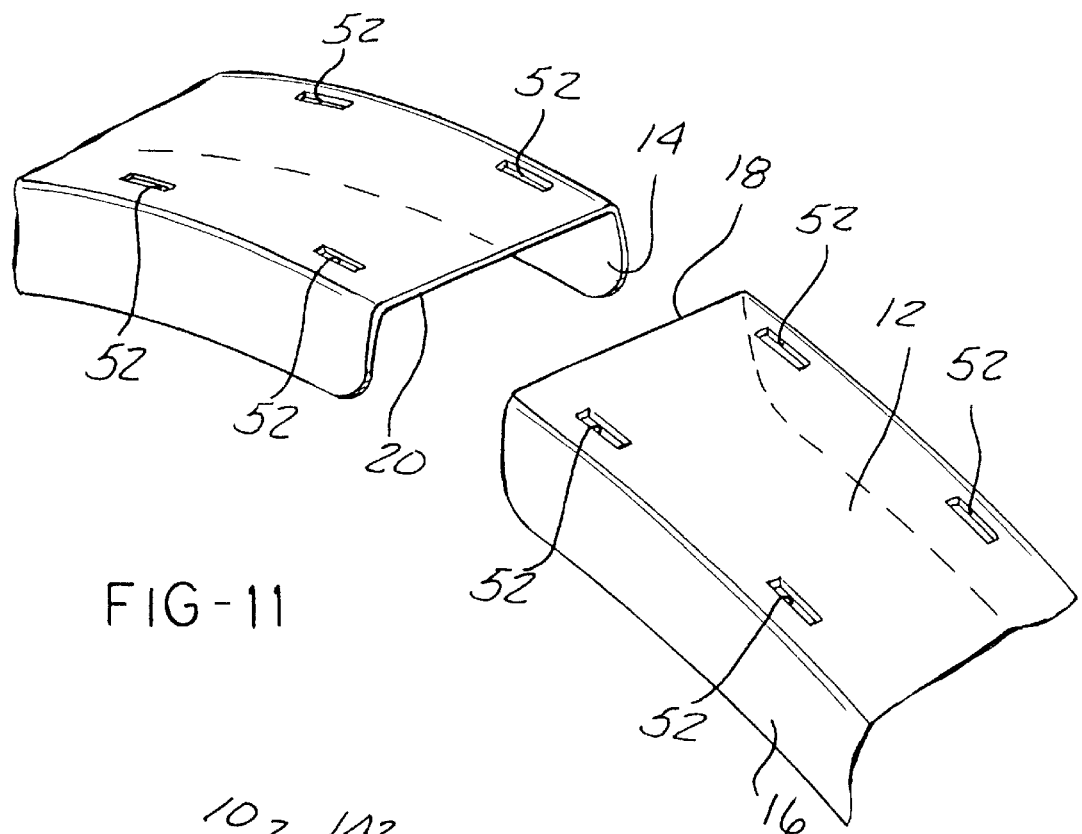
FIG. 11 is a partial, perspective view showing one embodiment of the housing mounting apertures in the annular band of the sealing ring.

A pair of mounting tabs 50 extend downwardly from the lower edge 44 and 48 of each of the side walls 36 and 38 and are insertable through apertures 52 formed adjacent each of the first and second ends 18 and 20 of the sealing ring 10 as shown in FIG. 11. The tabs 50, after insertion through the slots 52, are bent or otherwise formed or crimped into substantial engagement with the underlying surface of the central portion 12 of the sealing ring 10 to securely and fixedly mount each housing 32 and 34 to the sealing ring 10 as shown in FIG. 6. It will be understood that each housing 32 and 34 could be formed with only at least one mounting tab 50 which is insertable into one slot 52 in the annular band 11.

Figure 9:
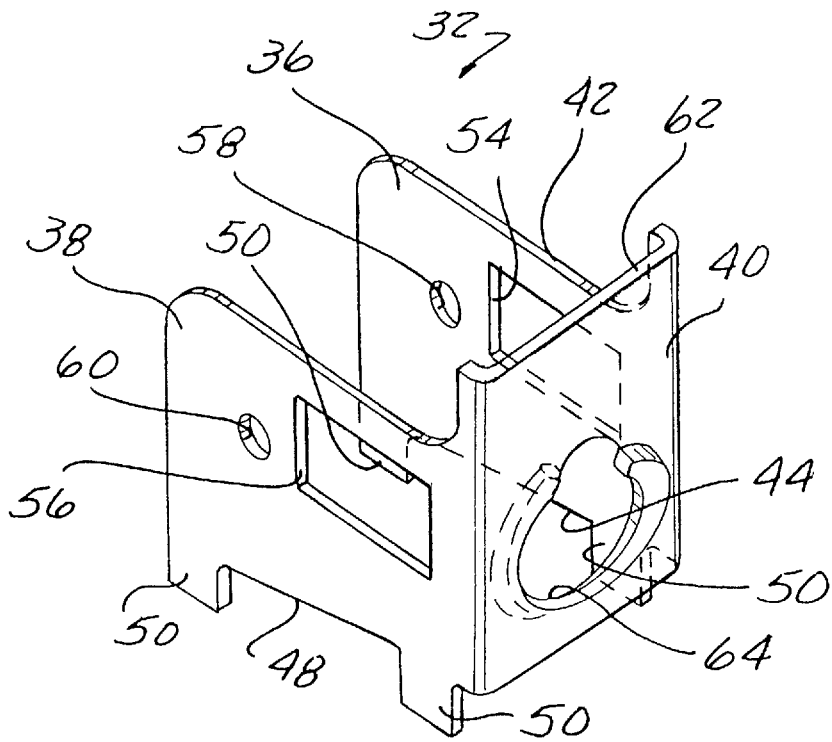
FIG. 9 is a perspective view of a first housing used in the lock mechanism of the present invention.

Co-axially aligned first apertures 54 and 56 is formed in the side walls 36 and 38 as shown in FIGS. 4 and 9. A second pair of co-axially aligned apertures 58 and 60 are also formed in the side walls 36 and 38, respectively. The purpose of the pairs of apertures 54, 56, 58 and 60 will become more apparent hereafter.

As also shown in FIGS. 3, 4, 6 and 9, the upper or top end portion 62 of the end wall 40 extends outward beyond the upper edges 42 and 46 of the side walls 36 and 38 to form a finger tab which is useful in closing the opposed first and second ends 18 and 20 of the sealing ring 10 about the mating mounting flanges of two devices.

A through bore or aperture 64 is formed in the end wall 40. The aperture 64 preferably carries an Acme type thread.

The second housing 34 is similar to the first housing 32 in that it includes a pair of side walls 70 and 72 which are joined at one end by an integral end wall 74. As shown in FIGS. 3–6 and 10, the side walls 70 and 72 are formed with upper edges 74 and 76, respectively, and arcuate shaped lower edges 78 and 80. A pair of mounting tabs 50 extend downward from each of the lower edges 78 and 80 of the side walls 70 and 72 for insertion into the slots 52 adjacent the first end 18 of the sealing ring 10 as described above and shown in FIGS. 6 and 11.

The upper or top end portion 82 of the end wall 74 also extends beyond the upper extent of the side walls 74 and 76 to form a finger tab opposing the finger tab on the upper end 62 of the end wall 40 of the first housing 32. The pair of finger tabs 62 and 82 provide a convenient means for an installer to grasp the two finger tabs 62 and 82 by the fingers on a single hand and forcibly urge the finger tabs 62 and 82 and the associated housings 32 and 34 toward each other to close the sealing ring 10 about the mating mounting flanges of two devices.

Figure 10:
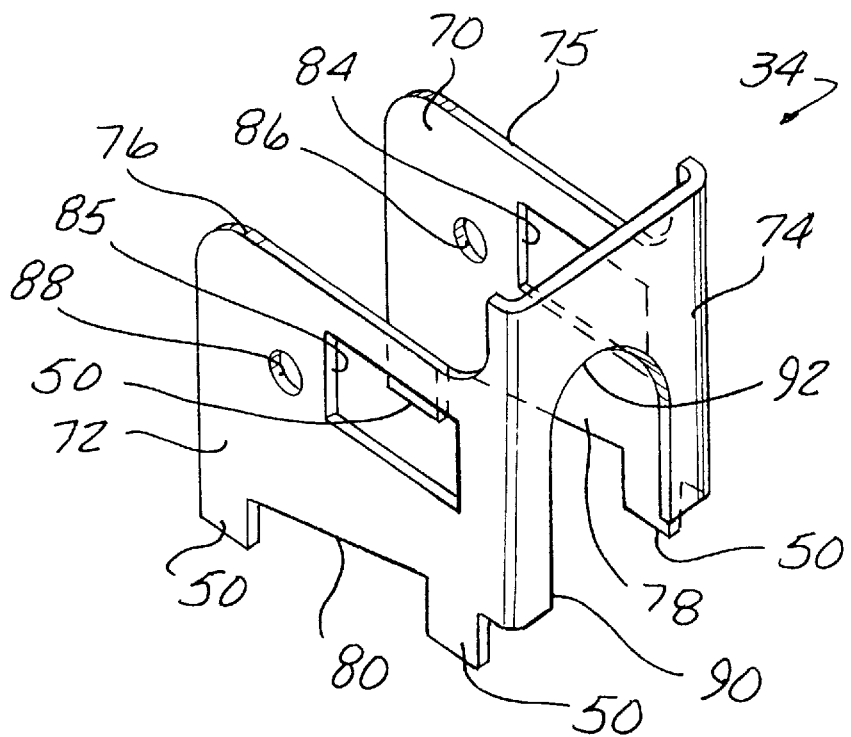
FIG. 10 is a perspective view of the second housing employed in the lock device of the present invention.

As shown in FIG. 10, a slot 90 extends from an open end at the lower edge of the end wall 74 to a closed, arcuate shaped end 92 intermediate the opposite end of the end wall 74.

A fastener 100 is rotatably mounted in the second housing 34. As shown in FIGS. 3–8, the fastener 100 is formed with a first or head end 102 and a second or tail end 104. Fastener 100 is formed of a suitable high strength material, such as a die cast zinc. Other materials which can be cast or molded, including plastic, may also be used to form the fastener 100.

The first or head end 102 has a reduced diameter end portion 106 which is provided with a slot 107 providing easy connection to a screwdriver to effect bi-directional rotation of the fastener 100. An elongated shank 108 extends from the end 106 to a pair of axially spaced, integral collars 110 and 112. The collars 110 and 112 are spaced apart by a reduced diameter annular groove or recess 114 seen in FIG. 6.

The tail or end portion 104 also includes an elongated shank 116 extending from the second annular collar 112 to a reduced diameter end 118, which also is provided with a screwdriver receiving slot 119. The provision of screwdriver receiving slots 107 and 119 at both ends 106 and 118 of the fastener 100 enables the fastener 100 to be threadingly rotated from either end 106 or 118 in the event one slot is stripped or access to one slot is blocked.

In mounting the fastener 100 in the housings 32 and 34, the tail end 104 of the fastener 100 is inserted through the open ended slot 92 in the end wall 74 of the second housing 34 until the second collar 112 clears the end wall 74 as shown in FIGS. 3–6. Fastener 100 is then moved radially outward from the sealing ring 10 to bring the annular recess 114 into engagement with the end 92 of the slot 90 through the end wall 74 of the second housing 34. In this manner, the first and second collars 110 and 112 on the fastener 100 are positioned on opposite sides of the end wall 74 of the second housing 34 to maintain the fastener 100 in a captive position.

When it is desired to lockingly close the sealing ring 10 about the mating mounting flanges of two devices, the sealing ring 10 is urged over the mating flanges. The finger tabs 62 and 82 on the housings 32 and 34 are then forcibly urged together enabling the second or tail end portion 104 of the fastener 100 to be axially inserted through the threaded aperture 64 in the end wall 40 of the first housing 32. A screwdriver or other tool is then engaged with the slot 107 in the first end 106 of the fastener 100 and rotated thereby rotating the fastener 100 and threadingly advancing the second end 104 through the threaded aperture 64 in the first housing 32. Such threaded extension of the fastener 100 through the threaded aperture 64 in the first housing 32 pulls the first and second housings 32 and 34 together thereby bringing the ends 18 and 20 of the sealing ring 10 into close proximity to tightly secure the sealing ring 10 about the mating mounting flanges of two devices. Opposite rotation of the fastener 100 will separate the ends 18 and 20 of the sealing ring 10 to permit removal of the sealing ring 10 from the mounting flanges on the two devices.

Figure 8:
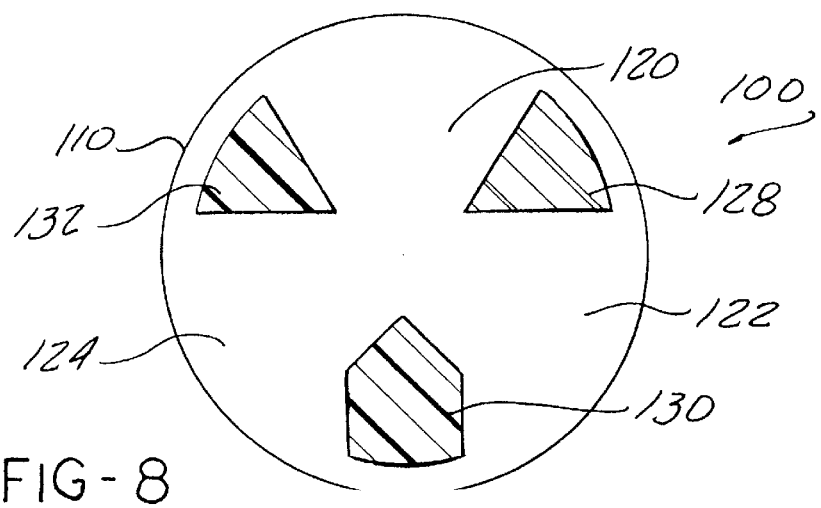
FIG. 8 is a cross-sectional view generally taken along line 8—8 in FIG. 7.

As shown particularly in FIG. 8, a plurality of intersecting slots 120, 122 and 124 are formed in the shank 108 of the first end portion 102 of the fastener 100. By way of example only, three slots 120, 122 and 124 generally disposed 120° apart are formed in the first end portion 102 and extend axially between the first collar 110 and the reduced diameter end portion 106. The slots 120, 122 and 124 extend radially through the first end portion 102 and are formed between solid, axially extending ribs 128, 130 and 132 in the first end portion 102. The purpose of the slots 120, 122 and 124 will become more apparent by referring to FIG. 4 which shows the fastener 100 mounted in the first and second housing 32 and 34.

Figure 2:
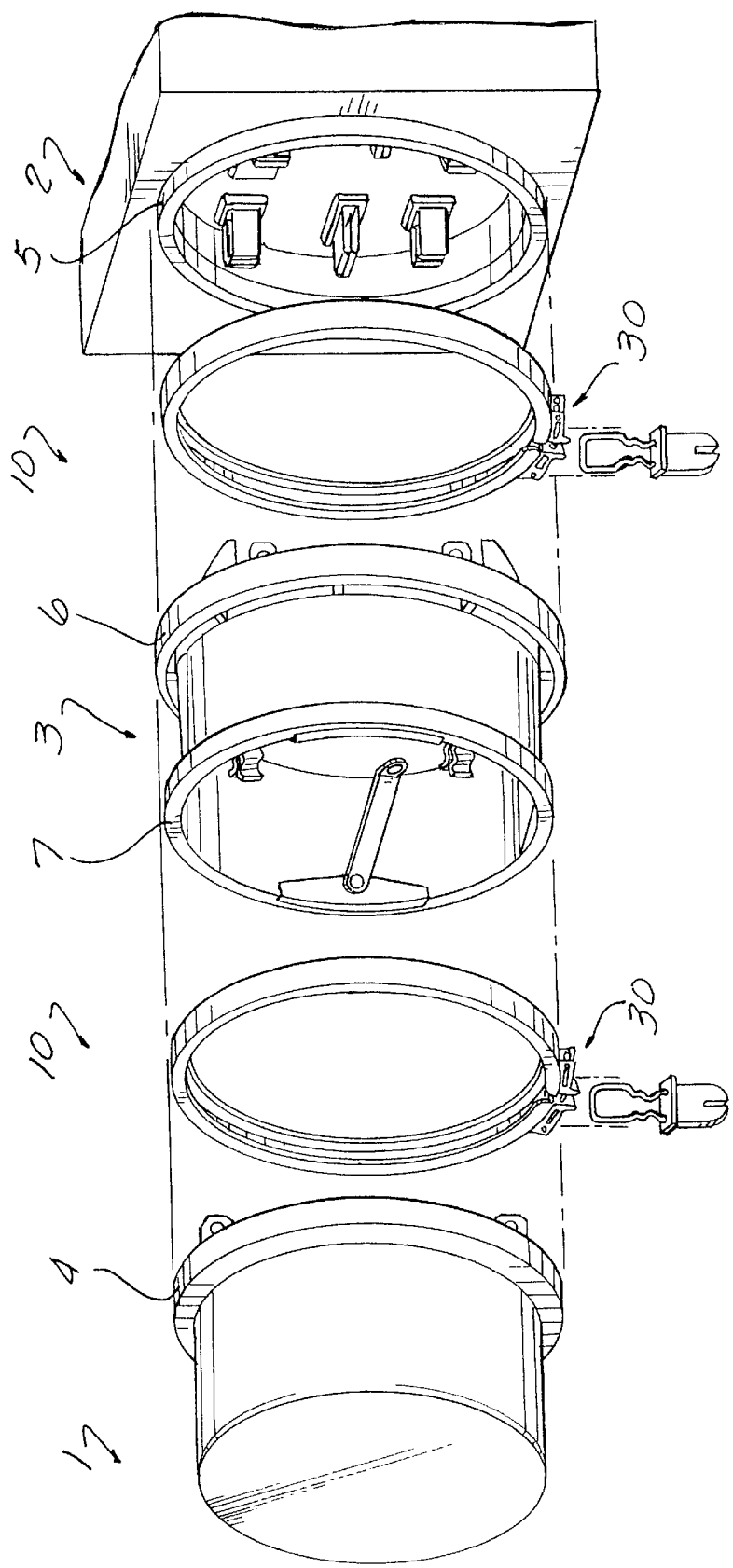
FIG. 2 is an exploded, perspective view of a conventional watthour meter, watthour meter socket adapter, and watthour meter socket employing sealing rings constructed in accordance with the teachings of the present invention.

The slots 120, 122 and 124 provide a plurality, i.e., six, of diametrical paths through the fastener 100 which allow the passage of a suitable security device 125 in FIG. 2, such as a wire seal or plastic padlock, to be inserted through the fastener 100 as well as through the aligned apertures 84 and 85 and/or the apertures 86 and 88 in the side walls 72 and 70 of second housing 34. The six paths extend individually through slots 122 and 124, slots 120 and 124, slots 122 and 120, slots 120 and 122, slots 124 and 120, and slots 124 and 122. Due to the number of different paths, one diametrical path will be in substantial alignment with the apertures 84 and 85 in the side walls 70 72 of the second housing 34 regardless of the angular rotated position of the fastener 100. This provides a significant advantage in tightly securing the sealing ring 10 about the mating mounting flanges of two devices as compared to previously devised sealing rings which only provide a minimal number of discrete rotated positions of the fastener which allow the passage of a padlock or wire seal through the slots in the housing and the fastener. In order to simplify the passage of the wire seal through the slot in the fastener as well as through the aligned apertures in the side walls of the housing, in previously devised sealing rings, the installer would have to overtighten or loosen the closing force on the housings and thereby on the sealing ring itself to enable the slot in the fastener to be aligned with the apertures in the side walls of the housing.

The padlock or wire seal 125 may also be inserted through the apertures 86 and 88 and one of the slots in the fastener 100 aligned with the apertures 86 and 88. The seal 125 can be the primary seal or act as a second seal in addition to another seal extending through the apertures 84 and 85.

Figure 7:
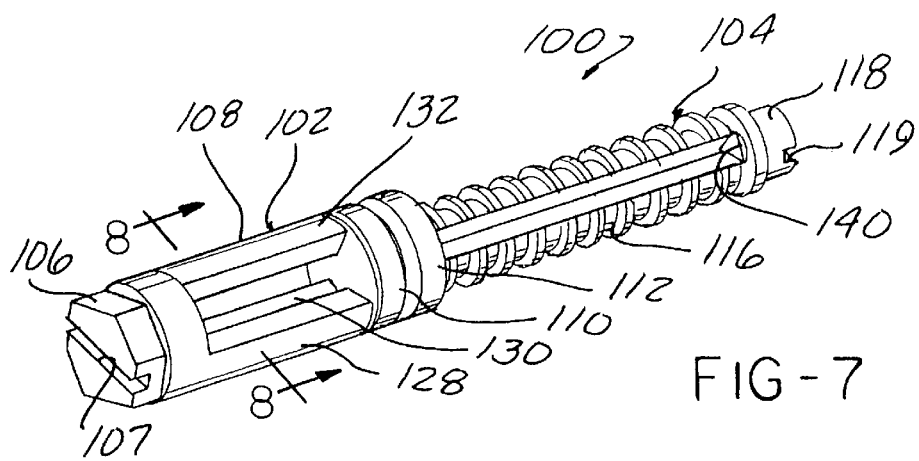
FIG. 7 is a enlarged, perspective view of the screw fastener employed in the lock device shown in FIGS. 3–6.

As shown in FIGS. 6 and 7, an optional diametrically extending slot 136 may also be formed in the second or tail end 104 of the fastener 100. The slot 136 is alignable with the apertures 54 and 56 in the side walls 36 and 38 of the first housing 32 to allow an additional security device, such as a wire seal or plastic padlock, to be inserted therethrough.

Referring now to FIGS. 12–17, there is depicted another embodiment of a lock mechanism 140 utilizable with the sealing ring 10 of the present invention. In this embodiment, the annular band 11 of the sealing ring 10 is substantially identical to that described above and shown in FIG. 11.

Further, the lock mechanism 140 is also similar to the lock mechanism 30 described above. Like elements in the lock mechanisms 30 and 140 are depicted with identical reference numbers. The differences in the lock mechanism 140 from the lock mechanism 30 will be described in detail hereafter.

Figure 13:
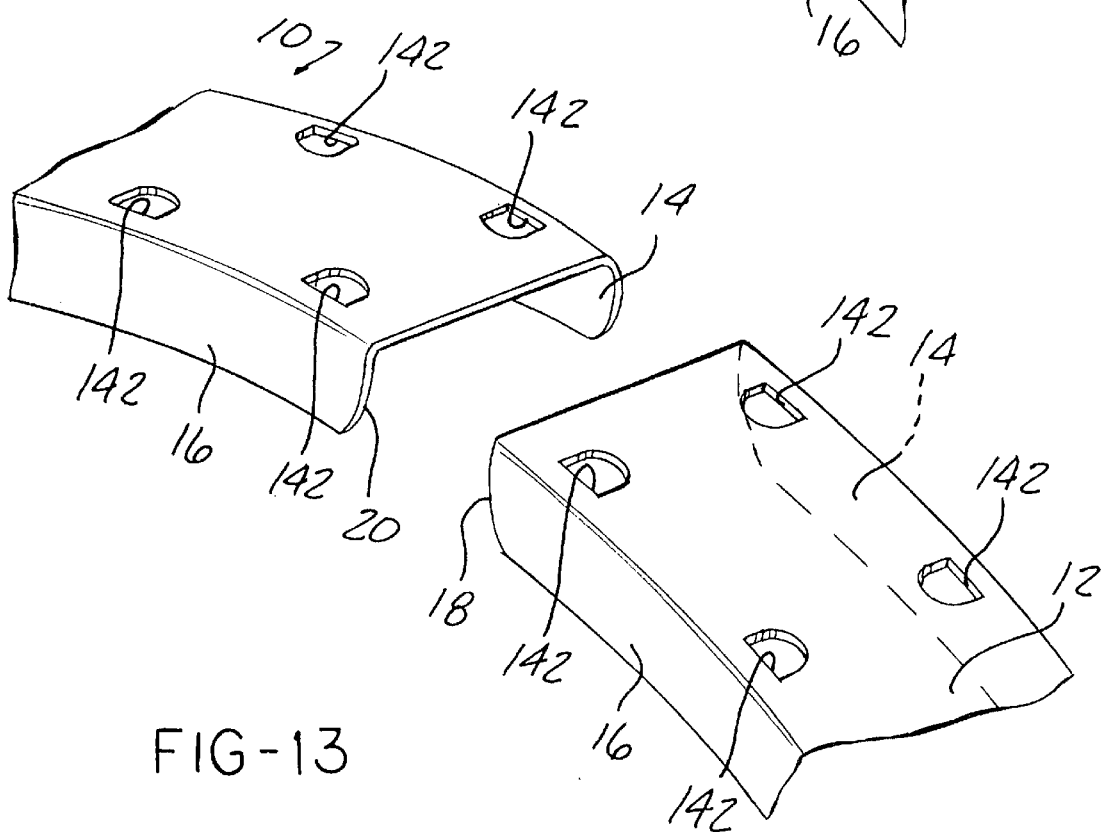
FIG. 13 is a partial, perspective view of another embodiment of the housing mounting apertures on the annular band of the sealing ring shown in FIG. 12.

As shown in FIG. 13, the annular band 11 has a plurality of mounting slots 142, such as four by example only, mounted adjacent each of the first and second ends 18 and 20, respectively. In this embodiment, each slot 142 has a generally hemispherical shape although circular, triangular, and other shapes may also be possible. Each of the slots 142 is designed to receive one of the mounting tabs on the housings 32 and 34 as described hereafter.

Figure 12:
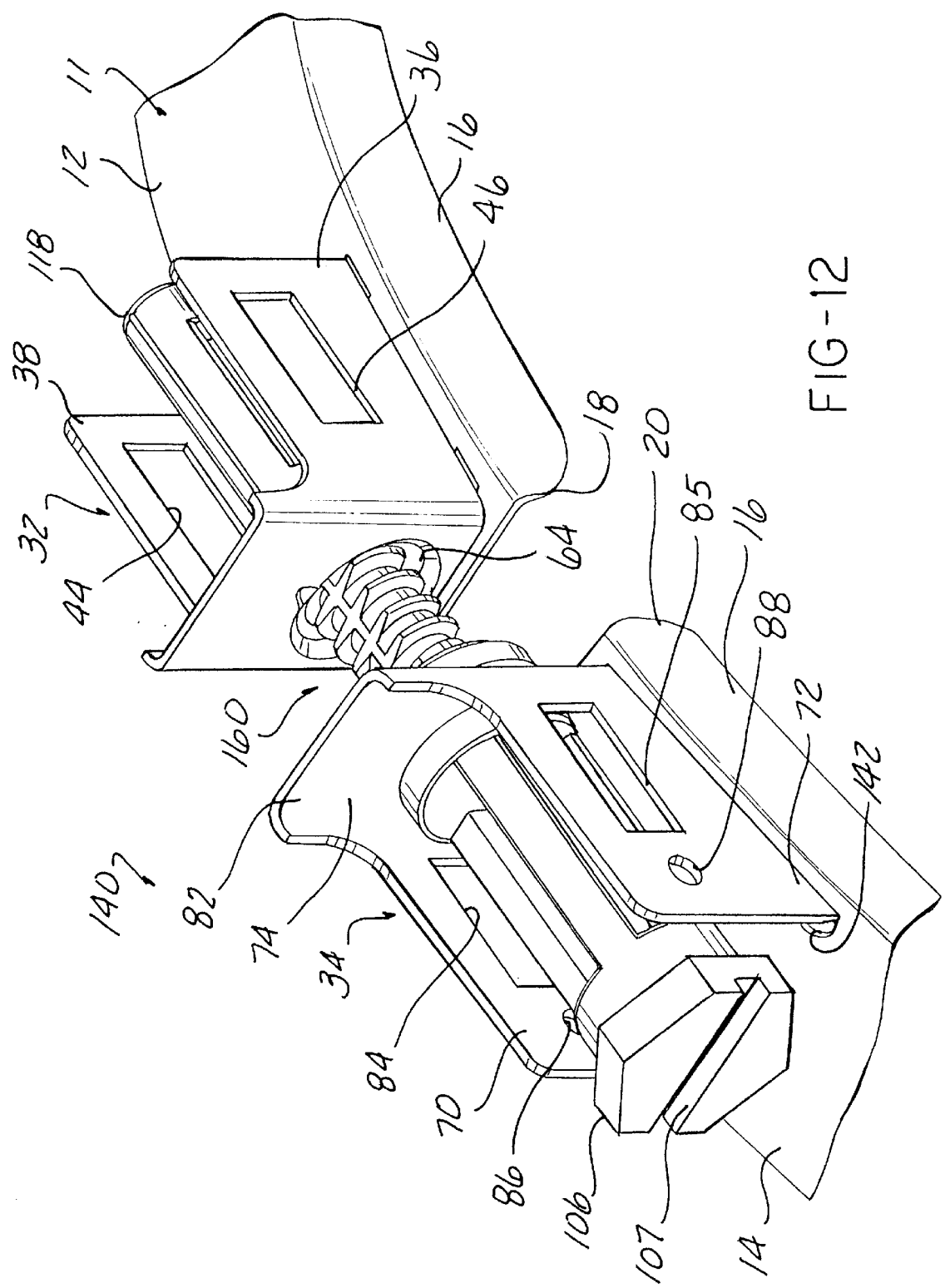
FIG. 12 is a partial, enlarged perspective view of another embodiment of the lock mechanism employed on the sealing ring of the present invention.
Figure 14:
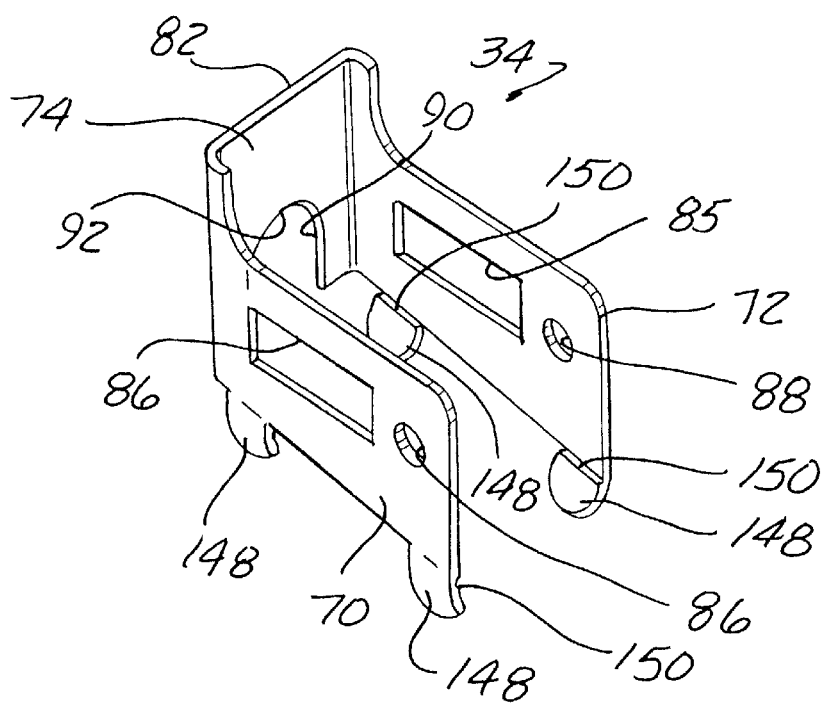
FIG. 14 is an enlarged, rear perspective view of the first housing shown in FIG. 12.

The lock mechanism 140 includes first and second housings 32 and 34. The first housing, as shown in FIGS. 12 and 14, includes a pair of side walls 36 and 38 interconnected at one end by an end wall 40 as in the prior embodiment. The end wall 40 has an enlarged upper end 62 forming a finger or grip tab. A single Acme thread 64 is integrally formed in the end wall 40, preferably during stamping of the first housing 32.

In this embodiment, each of the side walls 36 and 38 has an elongated slot 44 and 46, respectively, which replaces the slots 54 and 56 and the adjoining apertures 58 and 60 in the prior embodiment of the first housing 32.

The first housing 32 also includes at least one and, preferably, a plurality, such as four by example only, of mounting tabs each denoted by reference number 148. Each mounting tab 148 is interconnected to a lower end of one of the side legs 36 and 38 by a necked down portion or notch 150. Further, each of the mounting tabs 148 preferably extends at an inward extending, acute angle from each side wall 36 and 38 toward the opposing side wall 36 or 38. This angle or prebend, in combination with the notch 150, enables each of the mounting tabs 148 to be easily bent, crimped or otherwise formed into a tight fitting relationship or registry with the bottom surface of the central portion 12 of the annular band 11 to securely mount the first housing 32 to the first end 18 of the annular band 11.

Figure 15:
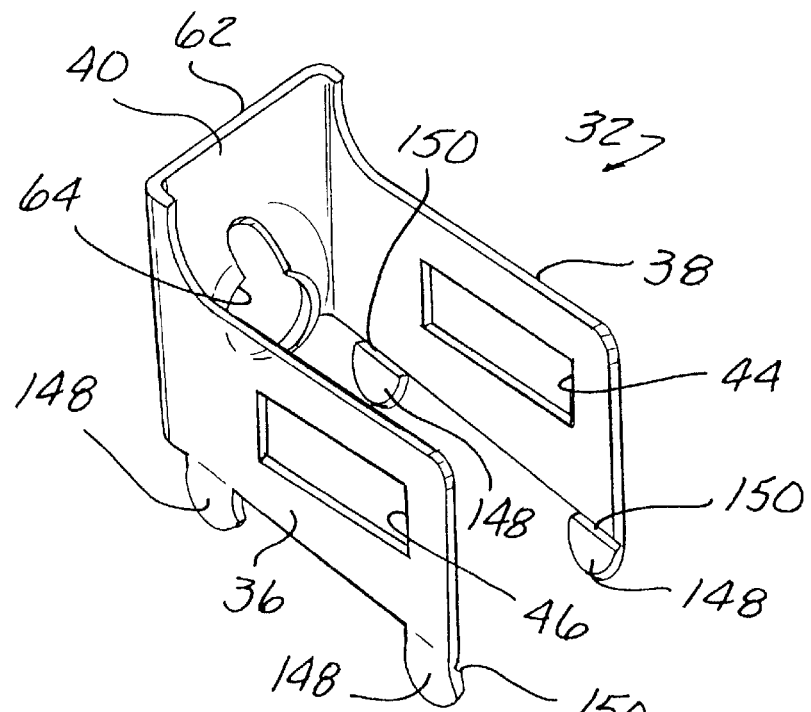
FIG. 15 is an enlarged, rear perspective view of the second housing shown in FIG. 12.

The second housing 34 shown in FIGS. 12 and 15 is substantially identical to the second housing 34 described above and shown in FIGS. 3–6 and 10. However, the mounting tabs 148, in this embodiment, are also connected to a lower portion of each of the side legs 70 and 72 by means of a notch 150. Further, each of the mounting tabs 148 is angularly bent out of the plane of the respective side leg 70 or 72 toward the opposing side leg 72 or 70.

In this embodiment, a fastener 160 includes a head end 106 with a tool receiving recess or slot 107 adapted for receiving a rotatable tool, such as a screwdriver, therein to effect bi-directional rotation of the fastener 160. A shank portion 108 extends from the head end 106. The shank portion 108 is formed of three ribs or spokes 128, 130 and 132 as described above. A plurality of radially extending, intersecting slots are formed between the ribs 128, 130 and 132 as also described above.

In this embodiment, the head end 106 is enlarged in diameter from the adjoining shank 108. This provides a suitable finger grip surface to enable finger rotation of the fastener 160 as described hereafter. Further, the head end 106 is formed with flats in a hex arrangement for easy finger grasping or for engagement with a rotatable tool, such as a wrench.

The shank 108 terminates in a first annular collar 110. A reduced diameter collar 114 extends axially from the first collar 110 to a second collar 114 and defines a slot or groove between the two collars 110 and 112. The length of the axial shaft 114 may be varied to suit the needs of a particular application. At a minimum, the length of the shaft 114 is sized to snugly conform to the thickness of the end wall 74 of the second housing 34 to substantially non-axially movable, but rotatably mount the head 106 and shank 108 of the fastener 160 to the second housing 34. Optionally, the shaft 114 may be slightly elongated to provide a certain amount of movement of the fastener 160 about the end wall 74 of the second housing 34. This enables not only axial movement of the fastener 160 relative to the end wall 74, but also pivotal movement which is useful in starting insertion of the opposed end of the fastener 160 into the threaded aperture in the end wall of the first housing 34.

A threaded portion 154 extends from the second collar 112 to a smooth second end 118 on the fastener 160. An axially extending, slot-shaped bore 156 is formed in the second end 118 of the fastener 160. The threaded portion 154 has opposed flats 155 as shown in FIGS. 16 and 17.

As shown in FIG. 16, a tool receiving recess or slot 119 is formed in the second end 118 for receiving a suitable rotatable tool, such as a screwdriver, to effect bi-directional rotation of the fastener 160 from the second end 118.

As shown in FIG. 17, when the second end 118 of the fastener 160 is threadingly inserted through the aperture 64 in the end wall 40 of the first housing 32, continued clockwise rotation of the head end 106 will draw the first housing 32 toward the second housing 34. This is due to the fact that the fastener 160 is non-axially movable via the mounting of the collars 110 and 112 about the end wall 74 of the second housing 34. However, the fastener 160 is free to rotate within the slot 90 in the end wall 74 of the second housing 34 as described above.

Since the fastener 160 is substantially non-axially movable with respect to the second housing 34, the enlarged head end 106, as shown in FIG. 17, remains in a predetermined axial position extending outward from the outer end of the side walls 70 and 72. This enables the enlarged head end 106 to be easily grasped by the fingers of a user to effect finger rotation of the fastener 160 to initially insert the second end 118 of the fastener 160 into the aperture 64 in the first housing 32 and to effect finger tightening of the sealing ring 10 about the mating mounting flanges of two devices. A rotatable tool, such as a screwdriver, may be inserted into the slot 107 in the enlarged head end 106 to effect complete tightening of the lock mechanism 140 and thereby the sealing ring 10 about the two mating mounting flanges.

During such rotation, the radially extending slots 122, etc., formed between the ribs 128, 130 and 132 in the shank 108 of the fastener 160 remain axially aligned with the apertures 85 and 86 in the side walls 72 and 70 of the second housing 34. This provides the full length of the apertures 85 and 86 and the full length of the slots 122, etc., for insertion of a security device or seal therethrough.

Referring now to FIGS. 19–24, there is depicted yet another embodiment of a lock mechanism constructed in accordance with the teachings of the present invention. The lock mechanism 170 shown in FIGS. 19–24 is similar to the lock mechanism 140 shown in FIGS. 12–17 and described above. Thus, identical reference numbers are used to refer to common components employed in both lock mechanisms 140 and 170.

The lock mechanism 170 includes a first housing 172 and a second housing 174 respectively mounted on the first and second ends 18 and 20 of the sealing ring 11. It should be noted that the lock mechanism 170 is depicted in FIGS. 19–21 in an opposite direction or view from the orientation of the lock mechanism 140 shown in FIG. 12.

Figure 22:
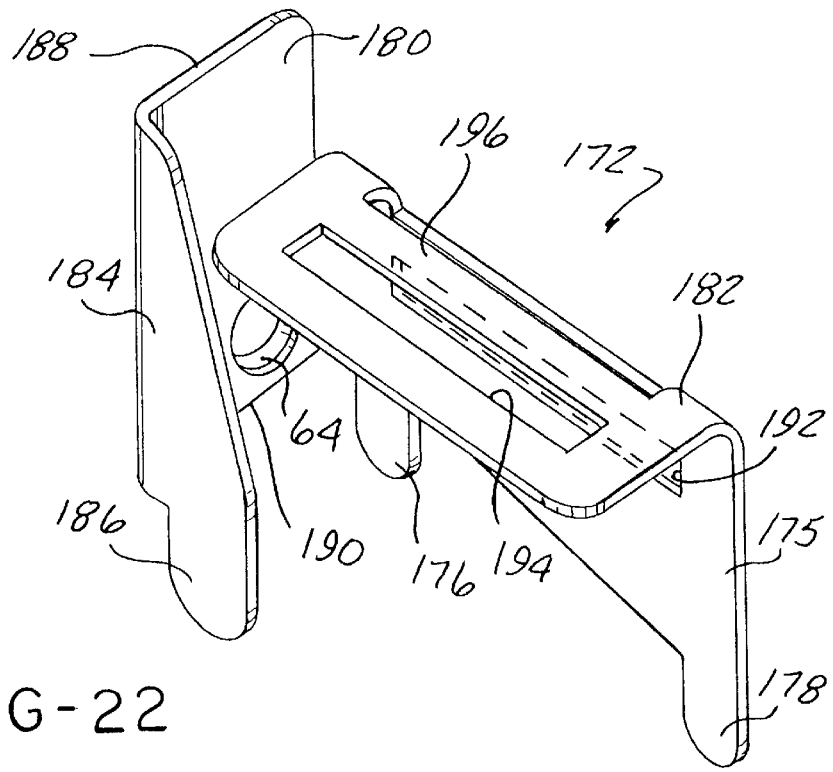
FIG. 22 is an enlarged, rear perspective view of the first housing of the embodiment shown in FIGS. 19–21.

The first housing 172 includes a first side wall 175 having a pair of mounting tabs 176 and 178 extending therefrom as shown in FIG. 22. The first side wall 175 extends generally perpendicular from an end wall 180 which carries the threaded aperture 64. A second side wall 182 is formed as an integral extension of the first side wall 175 and is angularly disposed, preferably perpendicularly, from the first side wall 175. In this orientation, as shown in FIGS. 19–22, the second side wall 182 extends generally planarily from the end wall 180.

For stability, a short third side wall 184 extends from a side edge of the end wall 180 opposite from the side edge from which the first side wall 175 extends. The third side wall 184 has a single mounting tab 186 formed thereon. The single mounting tab 186 is preferably larger in at least width than the mounting tabs 176 and 178 on the first side wall 175 to provide additional strength in securing the first housing 172 to the sealing ring 11. It should be noted that the third side wall 184 extends completely from a top edge 188 to a bottom edge 190 of the end wall 180.

A single elongated aperture or slot 192 extends linearly along the length of the first side wall 175. Another aperture 194 is formed in and extends linearly along the length of the second side wall 182. Preferably, a third aperture, in the form of an elongated slot 196, is formed at the juncture of the first and second side walls 175 and 182. The function of the apertures 192, 194 and 196 will be described hereafter in conjunction with the fastener means employed with the first housing 172.

Figure 23:
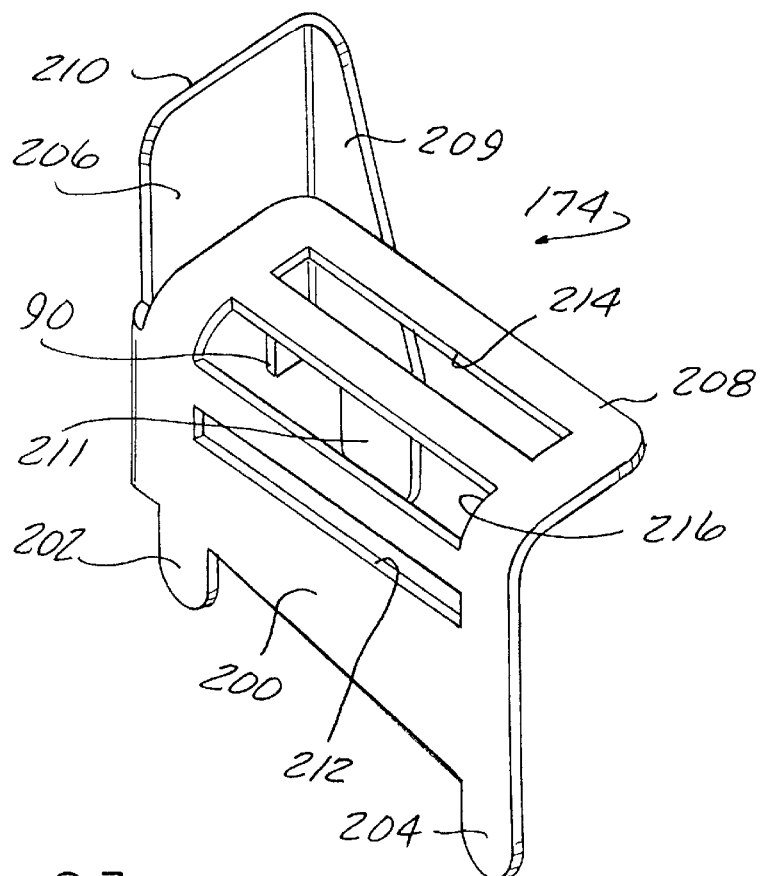
FIG. 23 is an enlarged, rear perspective view of the second housing shown in FIGS. 19–21.

The second housing 174 is similar to the first housing 172 in that it includes a first side wall 200 having mounting tabs 202 and 204, shown in FIG. 23, extending therefrom and mountable in the apertures formed in the second end 20 of the sealing ring 11. The first side wall 200 extends generally perpendicularly from an end wall 206. A second side wall 208 extends as an integral part of the first side wall 200 and disposed generally perpendicularly therefrom behind the end wall 206 as shown in FIGS. 19, 20 and 23.

The end wall 206 has an elongated length such that an upper end portion terminating in an upper edge 210 extends above the second side wall 208 to form a finger grip surface or tab in the same manner as described above in the preceding embodiments of the present invention. The end wall 206 carries the open-ended aperture or slot 90 as described above in the embodiment shown in FIG. 10. The second housing 174 also includes a third, shorter side leg or wall 209 extending from one side edge of the end wall 206. The third side wall 209 extends from the top edge 210 to an opposed bottom edge of the end wall 208. An enlarged mounting tab 211 is formed on the third side leg 209 for mounting the second housing 174 to the sealing ring 11. The mounting tab 211 is larger, at least in width, than the mounting tabs 202 and 204.

A first elongated aperture or slot 212 is formed in the first side wall 200. A second aperture or slot 214 is formed in the second side wall 208. Preferably, a third aperture or elongated slot 216 is formed at the juncture of the first and second side walls 200 and 208.

As shown generally in FIGS. 19–21, and in greater detail in FIG. 24, a lock mechanism 120 includes a fastener means, such as a screw 220, which is similar to fastener or screw 100 described above and shown in FIG. 7 or the fastener or screw 160 shown in FIG. 16. The fastener 220 includes a head end 106 with a tool receiving recess or slot 107 adapted for receiving a rotatable tool, such as a screwdriver. A shank or body 108 extends from the head end 106. The shank 108 is formed of three ribs or spokes 128, 130 and 132 as described above and shown in FIG. 16. A plurality of radially extending, intersecting slots are formed between the ribs 128, 130 and 132.

The shank 108 terminates in an end 222 opposite from the head end 106. In this embodiment, the end 222 has the same diameter as the overall outer diameter of the shank or body 108. The end 222 is spaced by a shank 224, shown in FIG. 20, from an enlarged diameter collar 226. The reduced diameter shaft 224 forms an annular recess between the first end 222 of the shank 108 and the collar 226 for rotatably receiving and non-axially mounting the fastener 220 in the slot 90 in the end wall 206 of the second housing 174.

A threaded portion 154 extends from the collar 226 to a smooth second end or shank 118. An axially extending, slot-shaped bore 156 is formed in the second end 118 of the fastener 220. The bore 156 has a length substantially equal to the length of the slots 192, 194 and 196 in the first housing 172 to provide a maximum opening for easy insertion of a security device. A tool receiving recess 119 is formed in the end of the end portion 118 for receiving a rotatable tool, such as a screwdriver, to effect bi-directional rotation of the fastener 220 from the second end 118.

In use, when the first and second housings 172 and 174 are fixedly mounted to the first and second ends 18 and 20 of the sealing ring 11 via the mounting tabs carried on each of the first and second housings 172 and 174, the slot 90 and the aperture 64 in the end walls 206 and 180 of the first and second housings 172 and 174, respectively, are aligned for receiving the fastener 220 as shown in FIGS. 19–21. With the fastener 220 rotatably, but non-axially movably mounted on the end wall 206 of the second housing 174, as described above, the shank end 108 and the second end 118 of the fastener 220 disposed between the second side walls 208 and 184 and the central wall 12 of the sealing ring 11. In this position, at least one of the intersecting slots formed in the shank 108 of the fastener 220 is selectively alignable with at least one of the apertures 212, 214 and 216 in the first and second side walls 200 and 208 of the second housing 174 at substantially any rotated position of the fastener 220. Similarly, the bore 156 is alignable with at least one of the apertures 192, 194 and 196 in the first and second side walls 174 and 182 of the first housing 174 at substantially any rotated position of the fastener 220. This enables a security device, such as a wire seal or plastic padlock, to be inserted through the aligned apertures in the housings 172 and 174 and the corresponding apertures or bores in the first and second ends of the fastener 220 at any rotated position of the fastener 220 necessary to tightly close the first and second ends 18 and 20 of the sealing ring 11 about the mating mounting flanges of the electrical devices on which the sealing ring 11 is mounted.

Referring now to FIGS. 25–28, there is depicted yet another embodiment of a lock mechanism 240 constructed in accordance with the teaching of the present invention. The lock mechanism 240 is similar to the lock mechanism 170 shown in FIGS. 19–24 except for several differences which will be described in detail.

In this embodiment, the lock mechanism 240 includes first and second housings 242 and 244. Preferably, the housing 242 and 244 are formed of a molded or cast material. In a preferred embodiment, the housings 242 and 244 are formed as zinc die castings.

Further, the first and second housings 242 and 244 are formed as mirror images of each other except for a reverse threading of a threaded aperture in each housing 242 and 244 as described hereafter. Thus, the first housing 242 is formed with a first side wall 246 which extends outward from a base 250 and an end wall 252. A second side wall 254 extends angularly from one end of the first side wall 246, preferably perpendicularly therefrom as shown in FIGS. 25–27.

Similarly, the second housing 244 is formed with a first side wall 256 which extends outward from a bottom wall 258 and an end wall 260. A second or top side wall 262 extends angularly from one end of the first side wall 256, preferably generally perpendicularly therefrom.

Figure 25:
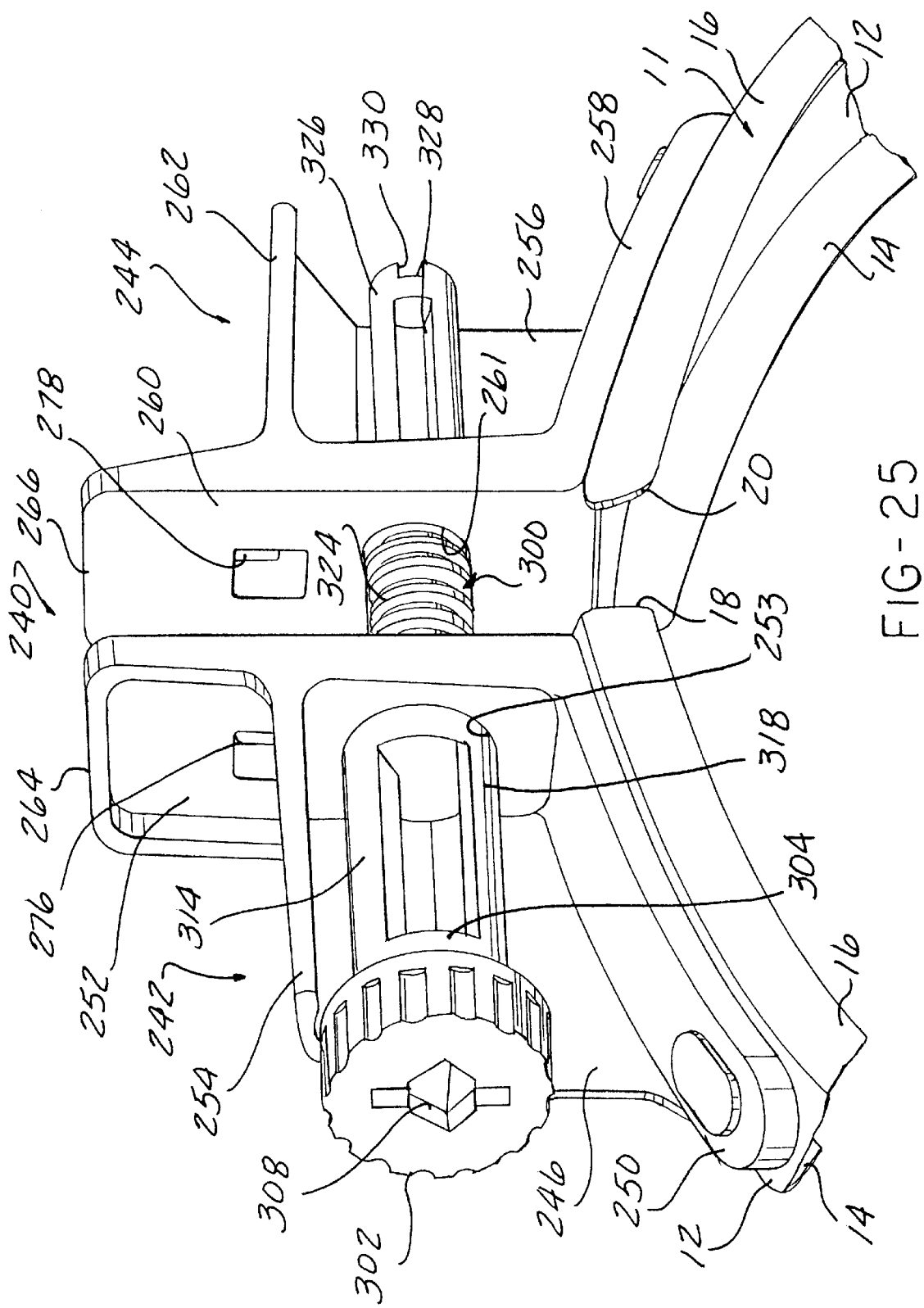
FIG. 25 is a partial, enlarged, perspective view of another embodiment of a lock mechanism employed on a sealing ring of the present invention.

As shown in FIGS. 25–27, one end portion of the end walls 256 and 280 extends beyond the respective second side walls 254 and 262 to form grip tabs 264 and 266, respectively. A threaded aperture 253 and 261 is respectively formed or molded in each end wall 252 and 260.

In the same manner as in the previous embodiment shown in FIGS. 19–24, a plurality of slots are formed in each housing 242 and 244 for receiving a security device, such as a wire seal therethrough. In this embodiment, the first and second housings 242 and 244 each include a first aperture, such as slots 268 and 270, formed in the first side walls 246 and 256. Second apertures, also in the form of slots 272 and 274, are respectively formed in the second side walls 254 and 262 of the housings 242 and 244.

Further, in this embodiment, an additional aperture 276 and 278 is formed in the end walls 252 and 260 of the first and second housings 242 and 244, respectively. The apertures 276 and 278 enable a security device, such as a wire seal, to be extended through and joined between the two housings 242 and 244.

A unique mounting means is employed to securely fix each of the housings 242 and 244 to respective ends 18 and 20 of the annular band 11. As shown in FIGS. 26 and 27, the bottom wall 250 and 256 of the housing 242 and 244, respectively, includes at least one, and preferably, a pair of projections generally denoted by reference number 280. The end of each projection 280 is spaced from the respective bottom wall 250 and 258 to form a notch 282. The projections 280 extend progressively further away from the bottom wall 250 and 258 in the direction of the notch 282. This enables the interior edge of the notch 282 to engage one edge of a slot 280 formed in the central portion 12 of the annular band to fix the position of one end of each of the housings 242 and 244 relative to the annular band 11.

A mechanical fastener, such as a rivet 286 extends through aligned apertures formed in the central portion of the band 12 and the bottom wall 250 and 256 of the housings 242 and 244 at a position spaced from the notched end 282. The fastener or rivet 286 in conjunction with the notched end 282 serve to fixedly mount and position each of the housing 242 and 244 on opposite ends 18 and 20, respectively, of the annular band 11.

This embodiment includes a fastener denoted generally by reference number 300 which is essentially similar to the fastener 226 described above and shown in FIGS. 19–21 and 24. The fastener 300, as clearly shown in FIG. 28, includes a head end 302 having a larger diameter than the diameter of an adjacent tubular shank 304. The head end 302 may be formed with flats as in the preceding embodiment. By example only, the head 302 may also be formed of a plurality of circumferentially spaced depressions 306 which form a tool or finger grip surface. In addition, a recess 308 is formed in the head end 302 for receiving an Allen wrench or similar tool to effect bi-directional rotation of the fastener 300.

The tubular shank 304 extends axially from the head end 302 and includes a plurality of intersecting slots 310, 312, etc., which are formed by axially extending, circumferentially spaced ribs 314, 316 and 318 in the same manner as described above and shown in the preceding embodiment. Three intersecting slots, only two of which are shown in FIG. 28, are preferably formed in the shank 304.

The tubular shank 304 terminates in a generally planar end 320 extending perpendicular to a longitudinal axis of the fastener 300. An axially extending, reduced diameter shank 322 extends axially from the end 320. The reduced diameter shank 322 forms an annular recess between the end 320 of the shank 304 and a threaded section 324. As shown in FIG. 26, the reduced diameter shank 322 is adapted to extend through an aperture formed in the end wall 254 of the housing 242 to enable the entire fastener 300 to freely move prior to threaded connection to the opposite housing 244 as described hereafter.

The threaded portion 324 extends axially from the reduced diameter section 322 to a generally tubular second end 326. The threads 324 may be complete circular threads or partial threads formed on opposed sides or a portion of the fastener 300.

An axially extending, slot-shaped, bore 328 extends transversely through the second end 326 of the fastener 300. A notch 330 is formed in the end of the second end 326 for receiving a suitable tool, such as a screwdriver, to effect rotation of the fastener 300 from the second end 326.

Suitable security devices, such as wire seals or plastic padlocks, not shown, may be secured through aligned apertures and slots in the housings 242 and 244 and the fastener 300 in a variety of positions depending upon the position of the fastener 300 relative to the slots in the housings 242 and 244 when the fastener 300 is rotated to completely tighten the sealing ring 10 about the mounting flanges of two mated devices.

For example, a security device may be inserted through one of the slots 310, 312, etc., in the first end of the fastener 300 and one of the aligned slots 268 or 272 in the first and second side walls 246 and 254 of the first housing 242. A security device may also be extended through and secured between the apertures 276 and 278 in the end walls 264 and 266 of the housing 242 and 244. In addition, a security device may be extended through the aperture 276 in the end wall 264 of the first housing 242, the slot 272 in the second side wall 254 in one of the slots 310, 312, etc., in the first end of the fastener 300.

A security device, used by itself or in addition to another security device employed with the first housing 242, may also be passed through the second end 326 of the fastener 300 and the second housing 344. Another possible connection path includes the bore 328 in the fastener 300 and one of the slots 270 or 274 in the side wall 256 of the second housing 244. A security device may also be passed through the aperture 278 in the end wall 266, the slot 274 in the second side wall 262 and/or through the bore 328 in the second end 326 of the fastener 300.

In summary, there has been disclosed a sealing ring having a unique lock mechanism which simplifies the manufacture and reduces the cost of the sealing ring. The lock mechanism also simplifies the installation of the sealing ring about the mounting flanges of two mating devices, such as a watthour meter, watthour meter socket adapter, and watthour meter socket. The lock mechanism may be engaged with a rotatable tool; i.e., a screwdriver, at either end. The lock mechanism also includes unique slots at each end of the lock mechanism and in both housings of opposite ends of the sealing ring to enable a security device or seal to be mounted at either end or in both ends of the lock mechanism on the sealing ring.

What is claimed is:

1. A sealing ring comprising:
   an annular band having first and second spaced ends;
   first and second housings respectively mountable on the first and second ends of the annular band, each of the first and second housings having two side walls;
   a threaded fastener having opposed first and second ends, the second end threadingly engagable with the first housing;
   means, formed on the second housing, for rotatably supporting the fastener on the second housing;
   an aperture formed in each of the side walls of the second housing;
   a plurality of circumferentially spaced, radially intersecting apertures formed in the first end of the fastener; and
   seal means, insertable through one aperture in at least one of the side walls of the second housing and a selected one of the intersecting slots in the first end of the fastener at one of a plurality of rotated positions of the fastener, for sealingly joining the first and second ends of the annular band.

2. The sealing ring of claim 1 wherein:
   at least two circumferentially spaced, radially intersecting slots are formed in the first end of the fastener.

3. The sealing ring of claim 1 wherein:
   three circumferentially spaced, radially intersecting slots are formed in the first end of the fastener.

4. The sealing ring of claim 1 further comprising:
   a plurality of circumferentially spaced, axially extending ribs formed in the first end of the fastener, each rib having an inner edge radially spaced from the inner edges of opposed ribs.

5. The sealing ring of claim 1 wherein the means for rotatably supporting the fastener in the second housing comprises:
   means for substantially non-axially movably supporting the fastener in the second housing.

6. The sealing ring of claim 5 wherein the means for rotatably supporting the fastener on the second housing comprises:
   an annular recess formed between the first and second ends of the fastener; and
   an end wall carried on the second housing;
   the annular recess rotatably engaged with the end wall.

7. The sealing ring of claim 6 wherein:
   the annular recess is disposed between a first end portion and an enlarged collar on the fastener; and
   the first end portion and the collar are disposed on opposite sides of the end wall.

8. The sealing ring of claim 5 wherein the means for rotatably supporting the fastener on the second housing comprises:
   two spaced annular collars formed on the fastener between the first and second ends thereof;
   a shaft extending axially between the first and second collars; and
   an end wall carried on the second housing and extending outward from the annular band;
   the shaft mounted on the end wall of the second housing with the first and second collars disposed on opposite sides of the end wall.

9. The sealing ring of claim 8 wherein:

an open-ended slot is formed in an the end wall of the second housing, the slot having a central edge.

10. The sealing ring of claim 8 wherein:

the axial length of the shaft between the first and second collars is selectible between a first length axially fixing the fastener to the second housing and a second length allowing limited pivotal movement of the fastener about the end wall of the second housing.

11. The sealing ring of claim 1 wherein:

the fastener has an enlarged diameter head formed at the first end, the enlarged head extending axially outward from the side wall of the second housing.

12. The sealing ring of claim 1 further comprising:

an end wall formed in the first housing; and a threaded aperture formed in the end wall of the first housing for threadably receiving the second end of the fastener.

13. The sealing ring of claim 12 wherein:

the threaded aperture is a stamped threaded aperture.

14. The sealing ring of claim 12 wherein:

the first and second housings are each molded as one piece members; and the threaded aperture is molded in the end wall of each of the first and second housings.

15. The sealing ring of claim 1 further comprising:

an elongated aperture formed in the second end of the fastener and alignable with apertures in the side legs of the first housing upon rotation of the fastener.

16. The sealing ring of claim 1 further comprising:

means, formed in at least one of the first and second ends of the fastener, for receiving a rotatable tool.

17. The sealing ring of claim 16 wherein the rotatable tool receiving means comprises a closed recess formed in at least one of the first and second ends of the fastener.

18. The sealing ring of claim 16 wherein the rotatable tool receiving means comprises:

a screwdriver receiving recess formed in at least one of the first and second ends of the fastener.

19. The sealing ring of claim 1 further comprising:

means, carried on the first and second housings and on the first and second ends of the annular band, for fixedly mounting the first and second housings to the first and second ends of the annular band.

20. The sealing ring of claim 19 wherein the mounting means comprises:

at least one aperture formed in each of the first and second ends of the annular band; and at least one formable tab extending from the first and second side walls of each of the first and second housings and slidably insertable through the aperture in the first and second ends of the annular bands, the formable tabs formable into a fixed relationship with the annular band to fixedly mount the first and second housings to the annular band.

21. The sealing ring of claim 20 wherein:

a plurality of apertures are formed in each of the first and second ends of the annular band; and a plurality of tabs extend from each of the first and second housings, one of the tabs disposable in one of the apertures.

22. The sealing ring of claim 20 further comprising:

a notch formed at the juncture of the tab and one of the side walls of the first and second housings.

23. The sealing ring of claim 20 further comprising:

the tab integrally extending from a bottom edge of each of the side walls of the first and second housing; and each tab preformed at an acute angle with respect to the corresponding side wall and extending angularly toward the opposed side wall of each of the first and second housings.

24. The sealing ring of claim 19 wherein the mounting means comprises:

each of the first and second housings having an integral bottom wall extending from one side wall and one end wall;

at least one projection having a notched end extending and spaced from the bottom wall;

a slot formed in the annular band; and the notched end of each housing engagable with an edge of the slot in the annular band.

25. The sealing ring of claim 24 further comprising:

a mechanical fastener extending through the bottom wall and the annular band at a position spaced from the projection on the bottom wall of the housing.

26. The sealing ring of claim 1 further comprising:

each of the first and second side walls of each of the first and second housings having an outer edge;

the end wall of each of the first and second housings having an outer edge; and the outer edge of each end wall extending outward from the outer edge of each of the corresponding first and second side walls to form a finger grip tab.

27. A sealing ring comprising:

an annular band having first and second spaced ends;

first and second housings respectively mountable on the first and second ends of the annular band, each of the first and second housings having an end wall and a plurality of side walls extending from the end wall;

a threaded fastener having opposed first and second ends, the second end threadingly engagable with the first housing;

means, formed on the second housing and the fastener, for rotatably and substantially non-axially movably supporting the fastener on the second housing;

a threaded aperture formed in the end wall of the first housing for threadably receiving the second end of the fastener;

each of the first and second side walls of each of the first and second housings having an outer edge;

the end wall of each of the first and second housings having an outer edge; and the outer edge of the end wall extending outward from the outer edge of each of the corresponding first and second side walls to form a finger grip tab.

28. A sealing ring comprising:

an annular band having first and second spaced ends mountable about abutted mounting flanges of two electric meter devices;

first and second housings respectively mountable on the first and second ends of the annular band, each of the first and second housings having an end wall extending outward from the annular band and a plurality of side walls extending from the end wall;

a threaded aperture formed in the end wall of the first housing;

a threaded fastener having opposed first and second ends, the fastener having external threads formed thereon, the external threads threadingly engaging the aperture in the first housing; and means, formed on the second housing and the fastener, for rotatably and substantially non-axially movably supporting the fastener on the second housing, the supporting means including:

the fastener having a tubular shank extending axially from a first end of the fastener;

an annular reduced diameter portion formed adjacent to an end of the shank; and the reduced diameter portion mountable through an aperture formed in the end wall of the second housing.

29. The sealing ring of claim 28 wherein the aperture in the end wall of the second housing comprises:

an open-ended slot formed in the end wall of the second housing, the slot having a central edge.

30. The sealing ring of claim 28 wherein:

the reduced diameter portion is an annular recess formed between the first and second ends of the fastener;

the annular recess rotatably engaged with the end wall on the second housing.

31. The sealing ring of claim 30 wherein:

the annular recess is disposed between a first end portion and an enlarged collar on the fastener; and the first end portion and the collar are disposed on opposite sides of the end wall.

32. The sealing ring of claim 28 wherein:

the reduced diameter portion includes:

two spaced annular collars formed on the fastener between the first and second ends thereof;

a shaft extending axially between the first and second collars; and the fastener mounted on the end wall of the second housing with the first and second collars disposed on opposite sides of the end wall.

33. The sealing ring of claim 32 wherein the aperture in the end wall of the second housing comprises:

an open ended slot formed in the end wall of the second housing, the slot having a central edge.

34. The sealing ring of claim 32 wherein:

the axial length of the shaft between the first and second collars is selectible between a first length axially fixing the fastener to the second housing and a second length allowing limited pivotal movement of the fastener about the end wall of the second housing.

35. The sealing ring of claim 28 further comprising:

the first end of the fastener having a first diameter;

an enlarged head formed on the first end and having a second diameter greater than the first diameter.

36. The sealing ring of claim 35 further comprising:

the enlarged head of the fastener axially projecting outward from one end of the side wall of the second housing.

37. A sealing ring comprising:

an annular band having first and second spaced ends;

first and second housings respectively mountable on the first and second ends of the annular band, each of the first and second housings having two spaced side walls;

a threaded fastener having opposed first and second ends;

means, on the second housing, for rotatably supporting the fastener on the second housing;

means carried on the first housing, for threadably receiving the second end of the fastener; and a closed recess, formed in at least one of the first and second ends of the fastener, for receiving a rotatable tool to rotate the fastener.

38. The sealing ring of claim 37 wherein the recess is formed in each of the first and second ends of the fastener.

39. A sealing ring comprising:

an annular band having first and second spaced ends;

first and second housings respectively mountable on the first and second ends of the annular band, each of the first and second housings having a plurality of side walls;

a threaded fastener having opposed first and second ends;

means, carried on the second housing, for rotatably supporting the fastener on the second housing;

means, carried on the first housing, for threadably receiving the second end of the fastener; and means, carried on the first and second housings and on the first and second ends of the annular band, for fixedly mounting the first and second housings to the first and second ends of the annular band, the mounting means including:

at least one aperture formed in each of the first and second ends of the annular band; and at least one formable tab extending from the side walls of each of the first and second housings and slidably insertable through the aperture in the first and second ends of the annular band, the tabs being bendable into fixed relationship with the annular band to fixedly mount the first and second housings to the annular band.

40. The sealing ring of claim 39 wherein:

a plurality of apertures are formed in each of the first and second ends of the annular band; and a plurality of tabs extend from each of the first and second housings, one of the tabs disposable in one of the apertures.

41. The sealing ring of claim 39 further comprising:

a notch formed at the juncture of each tab and one of the side walls of the first and second housing.

42. The sealing ring of claim 39 further comprising:

the tab integrally extending from a bottom edge of the side walls of the first and second housings; and each tab preformed at an acute angle with respect to the corresponding side wall and extending angularly toward a plane of the corresponding side wall of each of the first and second housings.

43. A sealing ring comprising;

an annular band having first and second spaced ends;

first and second housings respectively mountable on the first and second ends of the annular band, each of the first and second housings having a plurality of side walls;

a threaded fastener having opposed first and second ends;

means, carried on the second housing, for rotatably supporting the fastener on the second housing;

means, carried on the first housing, for threadably receiving the second end of the fastener; and means, carried on the first and second housings and on the first and second ends of the annular band, for fixedly mounting the first and second housings to the first and second ends of the annular band, the mounting means including:

each of the first and second housings having an integral bottom wall extending from one side wall and one end wall;

at least one projection having a notched end extending and spaced from the bottom wall;
a slot formed in the annular band; and
the notched end of each housing engagable with an edge of the slot in the annular band.

44. The sealing ring of claim 43 further comprising:
a mechanical fastener extending through the bottom wall and the annular band at a position spaced from the projection on the bottom wall of the housing.

45. A sealing ring comprising:
an annular band having first and second spaced ends;
first and second housings respectively mountable on the first and second ends of the annular band, each of the first and second housings having a plurality of side walls;
a threaded fastener having opposed first and second ends;
means, carried on the second housing, for rotatably supporting the fastener on the second housing;
means, carried on the first housing, for threadably receiving the second end of the fastener; and
means, carried on the first and second housings and on the first and second ends of the annular band, for fixedly mounting the first and second housings to the first and second ends of the annular band, the mounting means including:
 each of the first and second housings having an end wall disposed between two spaced side walls, the end wall projecting from the annular band;
 each of the first and second side walls of each of the first and second housings having an outer edge;
 the end wall of each of the first and second housings having an outer edge; and
 the outer edge of each end wall extending outward from the outer edge of each of the corresponding first and second side walls to form a finger grip tab.

46. sealing ring comprising:
an annular band having first and second spaced ends;
first and second housings respectively mountable on the first and second ends of the annular band, each of the first and second housings having a plurality of side walls;
a threaded fastener having opposed first and second ends;
means, carried on the second housing, for rotatably supporting the fastener on the second housing;
means, carried on the first housing, for threadably receiving the second end of the fastener; and
means, carried on the first and second housings and on the first and second ends of the annular band, for fixedly mounting the first and second housings to the first and second ends of the annular band, the mounting means including:
 each of the first and second housings having an end wall angularly disposed from the side walls;
 the side walls including two spaced side walls extending from opposite sides of the end wall, another side wall formed as an angular extension of one of the side walls; and
 an outer edge of the end wall projecting outward from the another side wall to form a finger grip tab.

47. A sealing ring comprising:
an annular band having first and second spaced ends;
first and second housings respectively mountable on the first and second ends of the annular band, each of the first and second housings having a plurality of side walls, the first housing having an end wall angularly disposed from the side walls;
a threaded fastener having opposed first and second ends;
means for rotatably supporting the fastener on the second housing;
a threaded aperture formed in the end wall of the first housing for threadably receiving the second end of the fastener
the first and second housings each molded as one piece members; and
the threaded aperture is molded in the end wall of each of the first and second housings.

48. A sealing ring comprising:
an annular band having first and second spaced ends;
first and second housings respectively mountable on the first and second ends of the annular band, each of the first and second housings having an end wall angularly disposed from a plurality of side walls;
a threaded fastener having opposed first and second ends, the second end threadingly engagable with the first housing;
means, formed on the second housing, for rotatably supporting the fastener on the second housing; and
the end wall of each of the first and second housings having an outer edge, the outer edge of the end wall extending outward from at least one of the side walls to form a finger grip tab.

49. The sealing ring of claim 48 further comprising:
a threaded aperture formed in the end wall of the first housing for threadably receiving the second end of the fastener.

50. The sealing ring of claim 49 wherein:
the threaded aperture is a stamped threaded aperture.

51. The sealing ring of claim 48 wherein:
the first and second housings are each molded as one piece members; and
the threaded aperture is molded in the end wall of each of the first and second housings.

52. A sealing ring comprising:
an annular band having first and second spaced ends;
first and second housings respectively mountable on the first and second ends of the annular band, each of the first and second housings having a plurality of side walls;
a threaded fastener having opposed first and second ends, the second end threadingly engagable with the first housing;
means, formed on the second housing, for rotatably supporting the fastener on the second housing; means, formed in at least one of the first and second ends of the fastener for receiving a rotatable tool to effect rotation of the fastener;
an aperture formed in at least one of the side walls of the first and second housings;
a plurality of circumferentially spaced, radially intersecting apertures formed in the first end of the fastener;
first seal means, insertable through one of the apertures in at least one of the side walls of the second housing and a selected one of the intersecting apertures formed in the first end of the fastener at one of a plurality of rotated positions of the fastener, for sealingly joining the first and second ends of the annular band;
means, carried on the fastener and the second housing, for non-axially movably rotatably supporting the fastener on the second housing;

an elongated aperture formed in the second end of the fastener and alignable with one aperture in the at least one side wall of the first housing upon rotation of the fastener; and second seal means, insertable through one aperture in at least one of the side walls of the first housing and the aperture in the second end of the fastener.

53. The sealing ring of claim 52 further comprising:

the enlarged head formed on one end of the fastener axially projecting outward from the side walls of the second housing.

54. A sealing ring of claim 53 wherein:

the enlarged head has a plurality of peripheral irregularities formed thereon.

55. The sealing ring of claim 54 further comprising:

recess means, formed in the enlarged head, for receiving a rotatable tool for rotating the fastener.

56. The sealing ring of claim 55 wherein the recess means is a closed recess.

57. A sealing ring comprising:

an annular band having first and second spaced ends;

first and second housings respectively mountable on the first and second ends of the annular band, each of the first and second housings having a plurality of side walls;

a threaded fastener having opposed first and second ends, the second end threadingly engagable with the first housing;

means, formed on the second housing, for rotatably supporting the fastener on the second housing; and an elongated aperture formed in the second end of the fastener and alignable with apertures in the side walls of the first housing upon rotation of the fastener.

58. A sealing ring comprising:

an annular band having first and second spaced ends;

first and second housings respectively mounted on the first and second ends of the annular band, each of the first and second housings having an end wall projecting from the annular band when the first and second housings are mounted on the annular band and at least two side walls extending from the end wall;

a threaded fastener having opposed first and second ends, the second end threadingly engagable with the first housing;

means, formed on the second housing, for rotatably supporting the fastener on the second housing;

at least one aperture formed in the first end of the fastener; and each of the two side walls of the second housing extending along the first end of the fastener, each of the two side walls having at least one aperture alignable with the aperture in the fastener at substantially all rotated positions of the fastener.

59. The sealing ring of claim 58 wherein the at least two side walls on the first and second housings comprise:

a first side wall projecting from one side edge of the end wall; and a second side wall projecting from the first side wall.

60. The sealing ring of claim 59 wherein:

the second side wall is formed as an integral extension of the first side wall.

61. The sealing ring of claim 60 wherein the at least two side walls further comprise:

a third side wall extending from an opposite side edge of the end wall.

62. The sealing ring of claim 59 wherein:

the end wall has an upper end portion extending farther from the annular band than the first and second side walls to form a finger grip tab.

63. The sealing ring of claim 60 wherein:

the end wall and the first and second side walls of each of the first and second housings are integrally formed as a one piece, integrally molded member.

64. The sealing ring of claim 61 further comprising:

means for mounting the first and second housings to the first and second ends of the annular band, respectively, the mounting means including:

at least one aperture formed in each of the first and second ends of the annular band; and at least one deformable tab extending from one of the first and third side walls of each of the first and second housings and slidably insertable through the aperture in the first and second ends of the annular band, the at least one deformable tab formable into a fixed relationship with the annular band to fixedly mount the first and second housings to the annular band.

65. The sealing ring of claim 64 further comprising:

two spaced deformable tabs formed on the first side wall; and one tab formed on the third side wall.

66. The sealing ring of claim 65 wherein:

the one tab on the third side wall is larger than each of the two tabs on the first side wall of the first and second housings.

67. The sealing ring of claim 63 further comprising:

means for mounting the first and second housings to the first and second ends of the annular band, respectively, the mounting means including:

each of the first and second housings having an integral bottom wall extending from one side wall and one end wall;

at least one projection having a notched end extending and spaced from the bottom wall;

a slot formed in the annular band;

the notched end of each housing engagable with an edge of the slot in the annular band; and a mechanical fastener extending through the bottom wall and the annular band at a position spaced from the projection on the bottom wall of the housing.

68. A sealing ring comprising:

an annular band having first and second spaced ends;

first and second housings respectively mountable on the first and second ends of the annular band;

a threaded fastener carried on the second housing and having opposed first and second ends, the second end threadingly engagable with the first housing to urge the first and second ends of the annular band together;

the first end of the fastener projecting axially outward from one end of the second housing and forming a finger grippable surface;

grip means, formed on the first end of the fastener, for facilitating finger gripping of the first end;

the grip means including a plurality of peripheral surface irregularities formed on the first end of the fastener.

69. The sealing ring of claim 68 wherein:

the fastener has a first diameter;

the first end of the fastener having an enlarged second diameter greater than the first diameter and forming an enlarged head end.

70. The sealing ring of claim 68 wherein the grip means comrpises:

a plurality of angularly disposed peripheral flats.

71. The sealing ring of claim 68 further comprising:

recess means, formed in the enlarged head, for receiving a rotatable tool for rotating the fastener.

72. The sealing ring of claim 71 wherein the recess means is a closed recess.

73. A sealing ring comprising:

an annular band having first and second spaced ends;

first and second housings respectively mountable on the first and second ends of the annular band;

a threaded fastener carried on the second housing and having opposed first and second ends, the second end threadingly engagable with the first housing to urge the first and second ends of the annular band together;

the first end of the fastener projecting axially outward from one end of the second housing and forming a finger grippable surface;

the second housing has an end wall and a pair of side walls extending in parallel from the end wall;

the fastener rotatably supported in the end wall; and a length of the fastener from the end wall to the first end being greater than a length of the side walls.

* * * * *